United States Patent [19]

Maeda et al.

[11] Patent Number: 5,179,318
[45] Date of Patent: Jan. 12, 1993

[54] CATHODE-RAY TUBE WITH INTERFERENCE FILTER

[75] Inventors: Michihisa Maeda, Yokkaichi; Yoshiyuki Hanada, Tsukuba; Hidemi Nakai, Tsukuba; Yasukazu Morita, Mobara; Yasuhiko Uehara, Chiba, all of Japan

[73] Assignees: Nippon Sheet Glass Co., Ltd., Osaka; Hitachi, Ltd., Tokyo, both of Japan

[21] Appl. No.: 546,412

[22] Filed: Jun. 29, 1990

[30] Foreign Application Priority Data

| Jul. 5, 1989 | [JP] | Japan | 1-173698 |
| Oct. 19, 1989 | [JP] | Japan | 1-272292 |
| Dec. 26, 1989 | [JP] | Japan | 1-337633 |
| Feb. 20, 1990 | [JP] | Japan | 2-39338 |

[51] Int. Cl.$^5$ .............. H04N 5/72; H01J 29/89; G02B 5/28
[52] U.S. Cl. .................. 313/466; 313/112; 313/371; 313/473; 313/474; 313/479
[58] Field of Search ............. 313/465, 466, 473, 474, 313/479, 478, 371, 112; 358/60; 350/166, 164, 163

[56] References Cited

U.S. PATENT DOCUMENTS

| 4,029,394 | 6/1977 | Araki | 313/371 |
| 4,683,398 | 7/1987 | Vriens et al. | 313/474 |
| 4,717,856 | 1/1988 | Kato | 313/466 |
| 4,798,994 | 1/1989 | Rijpers et al. | 313/478 |
| 4,846,551 | 7/1989 | Rancourt et al. | 350/166 |
| 4,859,902 | 8/1989 | De Leeuw et al. | 313/478 |
| 4,940,636 | 7/1990 | Brock et al. | 350/164 |
| 4,983,001 | 1/1991 | Hagiuda et al. | 313/112 |
| 4,990,824 | 2/1991 | Vriens et al. | 313/466 |

Primary Examiner—Donald J. Yusko
Assistant Examiner—John Giust
Attorney, Agent, or Firm—Woodcock Washburn Kurtz Mackiewicz & Norris

[57] ABSTRACT

A cathode-ray tube having a face plate which includes a phosphor layer provided at the inner surface side of a glass plate and an optical interference filter provided between the phosphor layer and the inner surface of the plate. The optical interference filter is constituted by high- and low-refractive index layers. The outermost layer of the optical interference filter in contact with the phosphor layer is an $Al_2O_3$ layer or a $ZrO_2$ layer having a physical thickness of 10 nm or more. The high-refractive index layer of the optical interference filter preferably consists of $TiO_2$, and its low-refractive index layer preferably consists of $Al_2O_3$.

15 Claims, 9 Drawing Sheets

CATHODE-RAY TUBE WITH INTERFERENCE FILTER

BACKGROUND OF THE INVENTION

1. Field of the Invention

The present invention relates to a cathode-ray tube having a face plate including an optical interference filter provided between the inner surface of a face plate for cathode-ray tube of a television set and a phosphor layer coated on the inner surface of the face plate for cathode-ray tube and consisting of a plurality of alternately stacked high- and low-refractive index material layers and, more particularly, to a projecting cathode-ray tube for enlarging and projecting an image in front of the cathode-ray tube on a screen via a projection lens arranged opposite to a phosphor screen and a process for producing the same.

2. Description of the Prior Art

A conventional projecting television set and a cathode-ray tube for use in the television set will be described below with reference to FIGS. 10A and 10B.

As shown in FIG. 10A, a conventional projecting television set for projecting an image on a screen in an enlarged scale includes three projecting cathode-ray tubes 71a, 71b and 71c for respectively emitting blue, green and red light, an optical system for focusing the light from the cathode-ray tubes 71a, 71b and 71c by using lenses 72a, 72b and 72c, respectively, and a screen 73 on which the respective images are projected. As shown in FIG. 10B, in a certain type of projecting cathode-ray tube 71 used in such a television set, a phosphor layer 8 is coated on the inner surface of a face plate 1 for cathode-ray tube, and an optical interference filter 7 consisting of alternate layers such as a short path edge filter is provided between the phosphor layer 8 and the inner surface of the face plate 1 for cathode-ray tube. An optical interference filter is used which has, as its cutoff wavelength, a wavelength $\lambda_O$ slightly longer than a center wavelength $\lambda$ of an emission spectrum of a phosphor as shown in FIG. 11. JP-A 273837/1986 discloses a face plate for cathode-ray tube having an optical interference film of this type.

In addition to specific characteristics as an optical interference filter, an optical interference filter to be formed on the inner surface of a face plate for cathode-ray tube must have a function of efficiently, externally transmitting light emitted from a phosphor upon radiation of an electron beam. In addition, a phosphor layer must have a strong adhesive force with respect to the optical interference filter and must be coated without forming pinholes.

In order to efficiently, externally transmit light emitted from a phosphor, an optical interference filter must be prevented from being colored to be blackened by a browning phenomenon caused by a radiated electron beam. In the optical interference filter according to the above prior art, however, if a layer in contact with the phosphor layer consists of $SiO_2$, the optical interference filter is colored upon continuous radiation of an electron beam.

In order to stably obtain an adhesive force of a phosphor layer to be coated on an optical interference filter and to obtain a phosphor coat surface without pinholes, the surface of the optical interference filter must be cleaned before coating In order to coat the interference filter on a face plate for cathode-ray tube with a strong adhesive force, the surface of the face plate for cathode-ray tube must be cleaned before coating. However, when an aqueous solution containing hydrofluoric acid used as a strong cleaning solution for a face plate for cathode-ray tube before formation of an optical interference filter is used to clean the surface of an optical interference filter before coating of a phosphor, if a layer in contact with the phosphor layer consists of $SiO_2$ as in the prior art, the optical interference filter may be partially dissolved or peeled. If, however, a neutral detergent or an aqueous solution containing a mineral acid such as hydrochloric acid is used to clean the surface of an optical interference filter, the surface cannot be sufficiently cleaned to make it difficult to avoid formation of small pinholes in a coated phosphor layer.

OBJECTS AND SUMMARY OF THE INVENTION

It is, therefore, an object of the present invention to provide a cathode-ray tube having a face plate having an optical interference filter which hardly causes a browning phenomenon upon radiation of an electron beam or X rays and therefore is not colored, and can efficiently, externally transmit light emitted from a phosphor from a display window.

It is another object of the present invention to provide a cathode-ray tube having a face plate in which an adhesive force between an optical interference filter and a phosphor layer is improved, and which has a phosphor layer with no small pinholes.

It is still another object of the present invention to provide a process for producing a cathode-ray tube having a face plate in which an oxide film to be formed in an optical interference filter of a face plate for cathode-ray tube is formed so that the oxide layer has a stoichiometric composition and a density which allows the oxide layer not to be colored upon radiation of an electron beam or X rays.

A cathode-ray tube having a face plate according to the present invention comprises:

(a) a plate having an inner surface to which irradiation of a cathode-ray beam is directed;

(b) a phosphor layer formed on the inner surface of the plate; and (c) an optical filter having a plurality of layers in which high-refractive index layers consisting of a high-refractive index material and low-refractive index layers consisting of a low-refractive index material are alternately stacked and an outermost layer having a physical thickness of 10 nm or more and consisting of $Al_2O_3$ or $ZrO_2$, wherein the optical interference filter is formed between the inner surface of the plate and the phosphor layer so that the outermost layer of the optical interference filter is in contact with the phosphor layer.

A cathode-ray tube having a face plate according to another feature of the present invention comprises:

(a) a plate having an inner surface to which irradiation of a cathode-ray beam is directed;

(b) a phosphor layer formed on the inner surface of the plate; and (c) an optical interference filter formed between the inner surface and the phosphor layer and having a plurality of layers in which high-refractive index layers consisting of a high-refractive index material and low-refractive index layers consisting of a low-refractive index material are alternately stacked, wherein each low-refractive index layer consists essentially of $Al_2O_3$, and each high-refractive index layer consists essentially of $TiO_2$, and a cutoff wavelength $\lambda_O$ of the plurality of layers is larger than a center wavelength of an emission spectrum of a phosphor constituting the phosphor layer.

A process for producing a cathode-ray tube having a face plate according to the present invention, the face plate having a phosphor layer and an optical interference filter formed between the phosphor layer and the inner surface of the plate, comprises the steps of:

(a) in order to alternately stack high-refractive index oxide layers and low-refractive index oxide layers on the inner surface of the plate to form the optical interference filter, coating an oxide to be formed into the oxide layers or an element which forms the oxide upon oxidation on the inner surface of the plate by evaporation in a reduced-pressure atmosphere containing $O_2$, and radiating $O_2$ ions onto the inner surface; and (b) forming the phosphor layer on the upper surface of the optical interference filter.

BRIEF DESCRIPTION OF THE DRAWINGS

The foregoing and other objects, features and advantages of the invention will be more readily understood upon consideration of the following detailed description of certain preferred embodiments of the invention, taken in conjunction with the accompanying drawings, in which.

DETAILED DESCRIPTION OF THE PREFERRED EMBODIMENTS

Embodiment A

Figure 1:
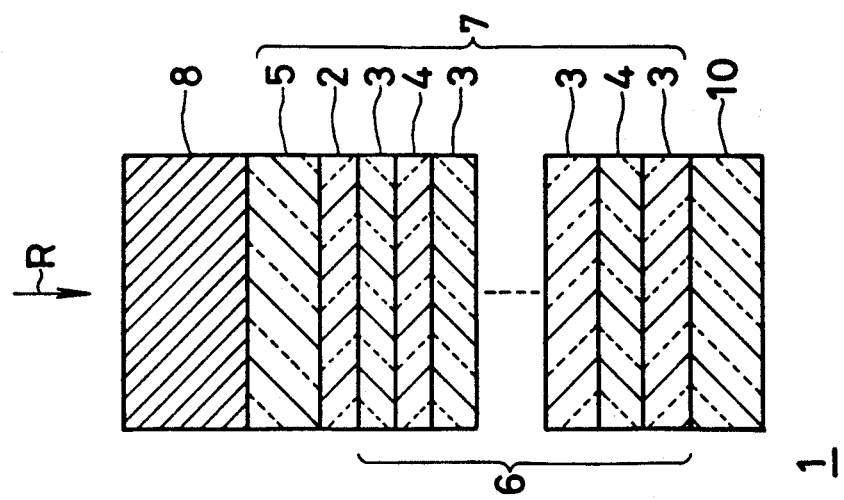
FIG. 1 is a partial sectional view showing a face plate for cathode-ray tube according to embodiment A of the present invention.

FIG. 1 shows a partial sectional view of a face plate for cathode-ray tube according to Embodiment A. This face plate 1 for cathode-ray tube is manufactured by stacking a glass plate 10, an optical interference filter 7 and a phosphor layer 8 in the order named. In an actual cathode-ray tube, cathode rays are radiated from an electron gun (not shown) in a direction indicated by an arrow R in FIG. 1 onto the phosphor layer 8. The optical interference filter 7 is formed by stacking, from the plate 10 side, a periodically alternating layer 6 which is constituted by an odd number (three or more) of layers and in which high-refractive index layers 3 having an optical thickness of 0.2 $\lambda_O$ to 0.3 $\lambda_O$ and low-refractive index layers 4 having an optical thickness of 0.2 $\lambda_O$ to 0.3$\lambda_O$ are alternately stacked and a layer closest to the phosphor layer 8 is a high-refractive index layer 3, a low-refractive index layer 2 having an optical thickness of 0.1$\lambda_O$ to 0.15$\lambda_O$, and an outermost layer 5 having a physical thickness of 10 nm or more and consisting of $Al_2O_3$ or $ZrO_2$.

If the physical thickness of the $Al_2O_3$ or $ZrO_2$ outermost layer 5 formed in contact with the phosphor layer 8 is 10 nm or less, the layer easily becomes discontinuous to fail to isolate the phosphor layer 8 and the lower-refractive index layer 2 formed at the two sides of the outermost layer 5 of the optical interference filter. Therefore, the physical thickness of the $Al_2O_3$ or $ZrO_2$ outermost layer 5 must be 10 nm or more.

Also, if the physical thickness of the outermost layer 5 is 10 nm or less, the optical interference filter is partially or entirely dissolved or peeled by most moderate hydrofluoric acid cleaning e.g., cleaning performed by spraying hydrofluoric acid having a concentration of 1% to 2% from a nozzle. Therefore, the physical thickness of the $Al_2O_3$ or $ZrO_2$ outermost layer 5 must be 10 nm or more so that the optical interference filter is not degraded by hydrofluoric acid cleaning.

The thickness of the $Al_2O_3$ or $ZrO_2$ outermost layer 5 is preferably large so as to increase an electron beam browning resistance of the optical interference filter and protect the periodically alternating layer 6 against hydrofluoric acid cleaning. However, if the film thickness is 10 μm or more, cost performance in the manufacture of the optical interference filter is reduced. Therefore, the physical thickness is preferably 10 μm or less. Most preferably, in consideration of optical characteristics of the optical interference filter and operability in the manufacture, the film thickness is an integer multiple not exceeding 10 times of $0.5\lambda$. The film thickness of the $Al_2O$ or $ZrO_2$ outermost layer 5 is finally determined on the basis of this value and in consideration of the film thickness to be reduced upon hydrofluoric acid cleaning.

The optical interference filter 7 of the face plate 1 for cathode-ray tube shown in FIG. 1 can be represented by the following relation (1):

phosphor layer $(8)/L'(L/2)H(LH)_k$/plate (10)   (1)

In relation (1), the high- and low-refractive index layers 3 and 4 having an optical thickness which is about 0.25 times the cutoff wavelength $\lambda_O$ are represented by H and L, respectively, the outermost layer 5 consisting of $Al_2O_3$ or $ZrO_2$ as a low-refractive index material is represented by L', and the low-refractive index layer 2 having an optical thickness substantially half that of the low-refractive index layer 4 is represented by L/2. k is a positive integer representing a repetition number of a pair of H and L layers. $H(LH)_k$ in relation (1) represents the periodically alternating layer 6.

k is preferably one to 15. If k is smaller than one, i.e., if the number of layers constituting the periodically alternating layer 6 is smaller than three, sharp cutoff characteristics of a transmittance of the optical interference filter 7 cannot be obtained at the cutoff wavelength $\lambda_O$. As a result, the cutoff characteristics with respect to an angle of light emitted from the phosphor layer 8 is degraded, and the transmittance in a reflection band is increased. If k is larger than 15, i.e., if the number of layers constituting the periodically alternating layer 6 is larger than 31, characteristics such as the light cutoff characteristics of the optical interference filter 7, the transmittance in a transmission band, and the ripple can be improved. However, a very long time is required to manufacture the optical interference filter, and more precise control must be performed for a film thickness and a film refractive index, resulting in low reproducibility in the manufacture of the optical interference filter. Therefore, the number of layers constituting the periodically alternating layer 6 of the optical interference filter 7 is preferably three to 31, and most preferably, nine to 25.

A relationship between the center wavelength $\lambda$ of an emission spectrum and the cutoff wavelength $\lambda_O$ as a design reference of the periodically alternating layer is as follows. That is, $\lambda_O$ is preferably larger than $1.18\lambda$ and smaller than $1.32\lambda$, and most preferably, larger than $1.18\lambda$, and smaller than $1.25\lambda$. If $\lambda_O$ is smaller than $1.18\lambda$, the cutoff wavelength may enter a spectral band extending from the center wavelength $\lambda$ of the emission spectrum of the phosphor to reduce a light emission amount.

If $\lambda_O$ is larger than $1.32\lambda$, a region having a large ripple in the transmission band moves closer to the center wavelength of the emission spectrum and the light emitted from the phosphor layer 8 at a large emission angle is not sufficiently cut off. In addition, since the thickness of each layer of the optical interference filter 7 is increased, $\lambda_O$ larger than $1.32\lambda$ is undesirable in terms of productivity.

The optical thickness of the low-refractive index layer 2 formed between the $Al_2O_3$ or $ZrO_2$ outermost layer 5 and the periodically alternating layer 6 is set to fall within the range of $0.1\lambda_O$ to $0.15\lambda_O$ having a central value which is ⅛ of a design wavelength $\lambda_O$ (a half of a ¼ wavelength of the design wavelength $\lambda_O$, which is represented by L/2 in relation (1)). If the optical thickness of the low-refractive index layer 2 is smaller than $0.1\lambda_O$ or larger than $0.15\lambda_O$, the optical characteristics of the optical interference filter 7, especially the transmittance in the transmission band is undesirably reduced. Most preferably, the optical thickness of the low-refractive index layer 2 is set to be substantially ⅛ of the design wavelength $\lambda_O$.

A high-refractive index material of the high-refractive index layer 3 of the optical interference filter 7 is not particularly limited as long as the material allows a film to have a refractive index of 1.8 or more in a visible range. Preferably, the material is one member or a mixture of two or more members selected from the group consisting of $TiO_2$, $Ta_2O_5$, $ZrO_2$, $HfO_2$, $SnO_2$, $PrTiO_3$, $In_2O_3$, and $ZnO$, and most preferably, $TiO_2$. An example of a low-refractive index material of the low-refractive index layers 2 and 3 is $SiO_2$, $Al_2O_3$ or MgFe.

Embodiment B

Figure 2:
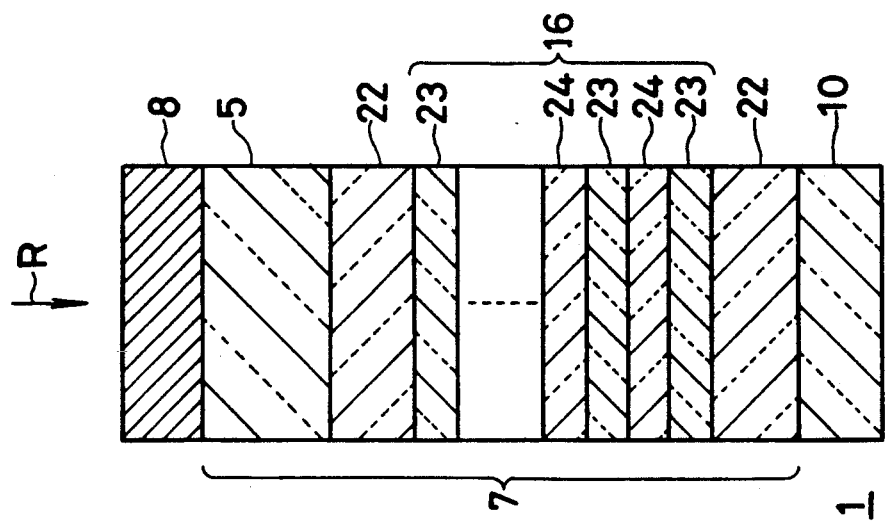
FIG. 2 is a partial sectional view showing a face plate for cathode-ray tube according to embodiment B of the present invention.

FIG. 2 shows a partial sectional view of a face plate for cathode-ray tube according to Embodiment B. This face plate 1 for cathode-ray tube is manufactured by stacking a glass plate 10, an optical interference filter 7 and a phosphor layer 8 in the order named. In an actual cathode-ray tube, cathode rays are emitted from an electron gun (not shown) in a direction indicated by an arrow R in FIG. 2 onto the phosphor layer 8. The optical interference filter 7 is formed by stacking, from the plate 10 side, a high-refractive index layer 22 having an optical thickness of about $(0.25\lambda + 0.125\lambda_O)$, a periodically alternating layer 16 which is constituted by an odd number (three or more) of layers and in which low-refractive index layers 23 having an optical thickness of about $0.25\lambda_O$, and high-refractive index layers 24 having an optical thickness of about $0.25\lambda_O$ are alternately stacked and a layer closest to the phosphor layer 8 is a low-refractive index layer 23, a high-refractive index layer 22 having an optical thickness of about $(0.25\lambda + 0.125\lambda_O)$, and an outermost layer 5 having a physical thickness of 10 nm or more and consisting of $Al_2O_3$ or $ZrO_2$.

The outermost layer 5 consists of the same materials as described in Embodiment A.

The optical interference filter 7 of the face plate 1 for cathode-ray tube shown in FIG. 2 is represented by the following relation (2):

phosphor layer
$(8)/L'(H'+H/2)L(HL)_k(H'+H/2)$/plate (10)   (2)

In relation (2), the high- and low-refractive index layers 24 and 23 having an optical thickness of substantially 0.25 times a cutoff wavelength $\lambda_O$ are represented by H and L, respectively, a layer consisting of a high-refractive index material having an optical thickness of substantially 0.25 times a wavelength $\lambda$ of an emission spectrum of the phosphor is represented by H', and the $Al_2O_3$ or $ZrO_2$ outermost layer 5 having a film thickness of 10 nm or more is represented by L'. k is a positive integer representing a repetition number of a pair of L and H layers. In relation (2), $L(HL)_k$ represents the periodically alternating layer 16, and (H'+H/2) represents the high-refractive index layer 22 having an optical thickness of about $(0.25\lambda+0.125\lambda_O)$.

If k is smaller than one, i.e., if the number of layers constituting the period alternate layer 16 is smaller than three, sharp cutoff characteristics of a transmittance of the optical interference filter 7 cannot be obtained at the cutoff wavelength $\lambda_O$. As a result, the cutoff characteristics with respect to an angle of light emitted from the phosphor layer 8 are degraded, and the transmittance of a reflection band is increased. If k is larger than 15, i.e., if the number of layers constituting the periodically alternating layer 16 is larger than 31, characteristics such as the light cutoff characteristic of the optical interference filter 7, the transmittance in a transmission band, and the ripple can be improved. However, a very long time is required to manufacture the optical interference filter, and more precise control must be performed for a film thickness and a film refractive index, resulting in low reproducibility in the manufacture of the optical interference filter. Therefore, the number of layers constituting the periodically alternating layer 16 of the optical interference filter 7 is preferably three to 31, and most preferably, nine to 25.

A relationship between the center wavelength $\lambda$ of the emission spectrum and the cutoff wavelength $\lambda_O$ as a design reference of the periodically alternating layer is as follows. That is, $\lambda_O$ is preferably larger than $1.05\lambda$ and smaller than $1.50\lambda$, and most preferably, larger than $1.10\lambda$ and smaller than $1.35\lambda$. If $\lambda_O$ is smaller than $1.05\lambda$, the cutoff wavelength may enter a spectral band extending from the center wavelength $\lambda$ of the emission spectrum of the phosphor to reduce a light emission amount. If $\lambda_O$ is larger than $1.50\lambda$, a region having a large ripple in the transmission band moves closer to the wavelength $\lambda$ of the emission spectrum and the light emitted from the phosphor layer 8 at a large emission angle is not sufficiently cut off. In addition, since the thickness of each layer of the optical interference filter 7 is increased, $\lambda_O$ larger than $1.50\lambda$ is undesirable in terms of productivity.

The optical thickness of the high-refractive index layer 22 formed between the $Al_2O_3$ or $ZrO_2$ outermost layer 5 and the periodically alternating layer 16 is set to be about $(0.25\lambda+0.125\lambda_O)$. Also, the optical thickness of the high-refractive index layer 22 formed between the periodically alternating layer 16 and the plate 10 is set to be about $(0.25\lambda+0.125\lambda_O)$. If the optical thickness of the high-refractive index layer 22 is largely shifted from $(0.25\lambda+0.125\lambda_O)$, the transmission band of the optical interference filter 7 is reduced to reduce the light emission amount.

The materials described in Embodiment A can be used as a high-refractive index material of the high-refractive index layers 22 and 24 of the optical interference filter 7 and a low-refractive index material of its low-refractive index layer 23.

In the above Embodiments A and B, the $Al_2O_3$ or $ZrO_2$ outermost layer 5 in contact with the phosphor layer 8 of the optical interference filter 7 prevents the optical interference filter 7 from being colored due to a browning phenomenon caused by an electron beam reaching the optical interference filter 7 through the phosphor layer 8. During cleaning performed before coating of a phosphor by using an aqueous solution containing hydrofluoric acid, the $Al_2O_3$ or $ZrO_2$ outermost layer 5 prevents hydrofluoric acid from penetrating into the optical interference filter 7. In addition, since the surface of the outermost layer 5 is etched so slightly as not to change the optical characteristics of the optical interference filter 7, the obtained clean surface can be strongly adhered to the phosphor layer 8. The periodically alternating layers 6 and 16 give a selective transmittance with respect to a wavelength of light by an interference effect of light and gives a directivity to light emitted from the phosphor. The high-refractive index layers 22 formed at two sides of the periodically alternating layer 16 reduce ripples in the transmission band.

Embodiment C

Figure 3:
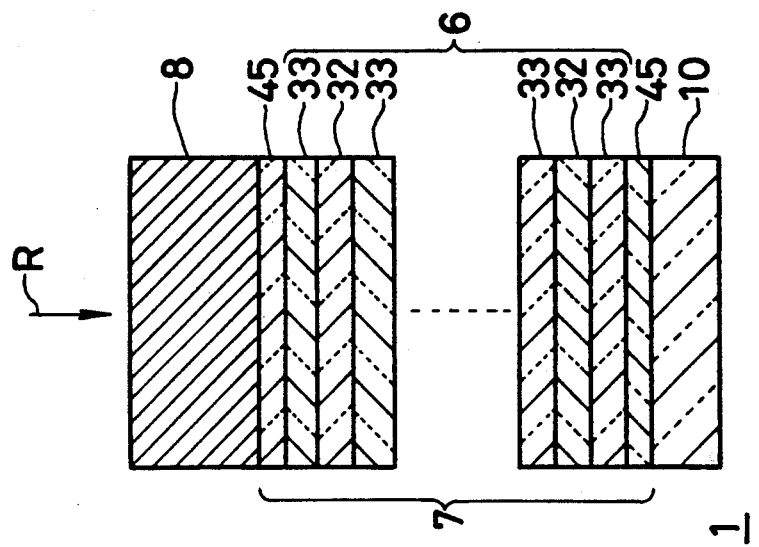
FIG. 3 is a partial sectional view showing a face plate for cathode-ray tube according to embodiment C of the present invention.

FIG. 3 shows a partial sectional view of a face plate for cathode-ray tube according to Embodiment C. This face plate 1 for cathode-ray tube is manufactured by stacking a glass plate 10, an optical interference filter 7 and a phosphor layer 8 in the order named. In an actual cathode-ray tube, cathode rays are radiated from an electron gun (not shown) in a direction indicated by an arrow R in FIG. 3 onto the phosphor layer 8. The optical interference filter 7 is formed by stacking, from the plate 10 side, a high-refractive index layer 34 consisting essentially of $TiO_2$ having an optical thickness of about $(0.125\lambda_O+0.25\lambda)$, a periodically alternating layer 16 in which low-refractive index layers 32 consisting essentially of $Al_2O_3$ having an optical thickness of about $0.25\lambda_O$ and high-refractive index layers 33 consisting essentially of $TiO_2$ having an optical thickness of about $0.25\lambda_O$ are alternately stacked an odd number of times and a layer closest to the phosphor layer 8 is a low-refractive index layer 32, and a high-refractive index layer 34 having an optical thickness of about $(0.125\lambda_O+0.25\lambda)$.

The optical interference filter 7 of the face plate 1 for cathode-ray tube shown in FIG. 3 is represented by the following relation (3).

$$\text{phosphor layer } (8)/(H'+H/2)L(HL)_k(H'+H/2)/\text{plate (10)} \quad (3)$$

In relation (3), the high- and low-refractive index layers 33 and 32 having an optical thickness of about $0.25\lambda_O$ are represented by H and L, and the high-refractive index layer consisting essentially of $TiO_2$ having an optical thickness which is about 0.25 times a wavelength $\lambda$ of an emission spectrum of the phosphor is represented by H'. k is a positive integer representing a repetition number of a pair of L and H layers. In relation (3), $L(HL)_k$ represents the periodically alternating layer 16, and $(H'+H/2)$ represents the high-refractive index layer 34 having an optical thickness of about $(0.25\lambda+0.125\lambda_O)$.

In the optical interference filter 7 having the above arrangement, each layer can be coated by a known film thickness control method for a ¼ wavelength. Unlike a method as disclosed in Table 1 in JP-A 273837/1986, since precise control need not be performed to shift an optical thickness from a design wavelength in accordance with the type of layer, the optical characteristics can be obtained with good reproducibility.

Embodiment D

Figure 4:
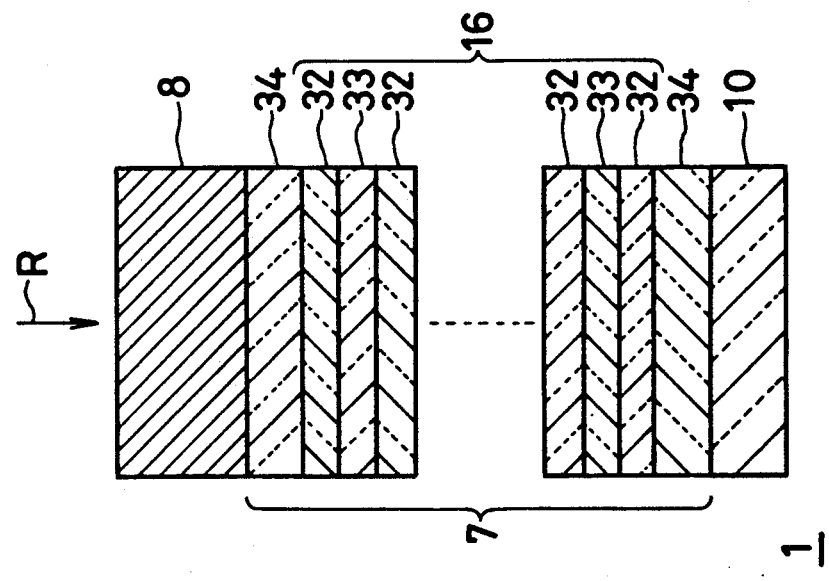
FIG. 4 is a partial sectional view showing a face plate for cathode-ray tube according to embodiment D of the present invention.

FIG. 4 shows a partial sectional view of a face plate for cathode-ray tube according to Embodiment D. This face plate 1 for cathode-ray tube is manufactured by stacking a glass plate 10, an optical interference filter 7 and a phosphor layer 8 in the order named. In an actual cathode-ray tube, cathode rays are radiated from an electron gun (not shown) in a direction indicated by an arrow R in FIG. 4 onto the phosphor layer 8. The optical interference filter 7 is formed by stacking, from the plate 10 side, a low-refractive index layer 45 consisting essentially of Al$_2$O$_3$ having an optical thickness of about 0.125$\lambda_O$, a periodically alternating layer 16 in which high-refractive index layers 33 consisting essentially of TiO$_2$ having an optical thickness of about 0.25$\lambda_O$ and low-refractive index layers 32 consisting essentially of Al$_2$O$_3$ having an optical thickness of about 0.25$\lambda_O$ are alternately stacked an odd number of times and a layer closest to the phosphor layer 8 is a high-refractive index layer 33, and a low-refractive index layer 45 having an optical thickness of about 0.125$\lambda_O$.

The optical interference filter 7 of the face plate 1 for cathode-ray tube is represented by the following relation (4):

phosphor layer (8)/(L/2)H(LH)$_k$(L/2)/plate (1)   (4)

In relation (4), L, H and k have the same meanings as in Embodiment C. H(LH)$_k$ in relation (4) represents the periodically alternating layer 16.

In the above optical interference filter 7 in which a layer consisting of or consisting essentially of Al$_2$O$_3$ having a refractive index of about 1.6 is used as the low-refractive index layers 32 and 45, a reflectivity of incident light is preferably reduced to increase a transmittance in a transmission band having a wavelength shorter than a design wavelength $\lambda_O$ (cutoff wavelength).

In the above Embodiments C and D, as another component which can be contained in Al$_2$O$_3$ of the low-refractive index layers 32 and 45, SiO$_2$ or MgF$_2$ having a refractive index lower than that of Al$_2$O$_3$ can be used. In addition, an oxide having a refractive index higher than that of Al$_2$O$_3$ can be contained in an amount not so as to cause a large change in refractive index of Al$_2$O$_3$.

When an electron beam coloring resistance of the optical interference filter 7 is an important factor, the low-refractive index layers 32 and 45 preferably consist of Al$_2$O$_3$ having a highest coloring resistance with respect to radiation of an electron beam or X rays. When it is important to increase a refractive index difference between the high-refractive index layers 33 and 34 to obtain sharp wavelength cutoff characteristics of the optical interference filter 7, SiO$_2$ or MgF$_2$ having a refractive index lower than that of Al$_2$O$_3$ can be contained.

Another component which can be contained in TiO$_2$ of the high-refractive index layers 33 and 34 can be contained in an amount not so as to cause a large decrease in refractive index of the high-refractive index layers 33 and 34 consisting of TiO$_2$. Examples of the component are oxides such as Al$_2$O$_3$, SiO$_2$, Ta$_2$O$_5$, ZrO$_2$, SnO$_2$, CeO$_2$, Pr$_6$O$_{11}$, Y$_2$O$_3$, Yb$_2$O$_3$, and HfO$_2$.

The high-refractive index layers 33 and 34 and the low-refractive index layers 32 and 45 can be manufactured by a vacuum vapor deposition method, an ion assist deposition method, and an ion plating method, all of which are conventionally known. By using these methods, the high-refractive index layers 33 and 34 consisting of TiO$_2$ having a refractive index of 2.3 to 2.4 and the low-refractive index layers 32 and 45 consisting of Al$_2$O$_3$ having a refractive index of 1.6 to 1.7 can be manufactured. In order to obtain sharp wavelength cutoff characteristics as important optical characteristics of the optical interference filter 7, a refractive index difference between the high-refractive index layers 33 and 34 and the low-refractive index layers 32 and 45 is preferably increased. When the optical characteristics of the optical interference filter are important, the high-refractive index layers 33 and 34 preferably consist of only TiO$_2$ having a largest refractive index of oxides. In the optical interference filter 7, the refractive index difference between the high-refractive index layers 33 and 34 and the low-refractive index layers 32 and 45 is preferably selected to be 0.3 or more.

Figure 11:
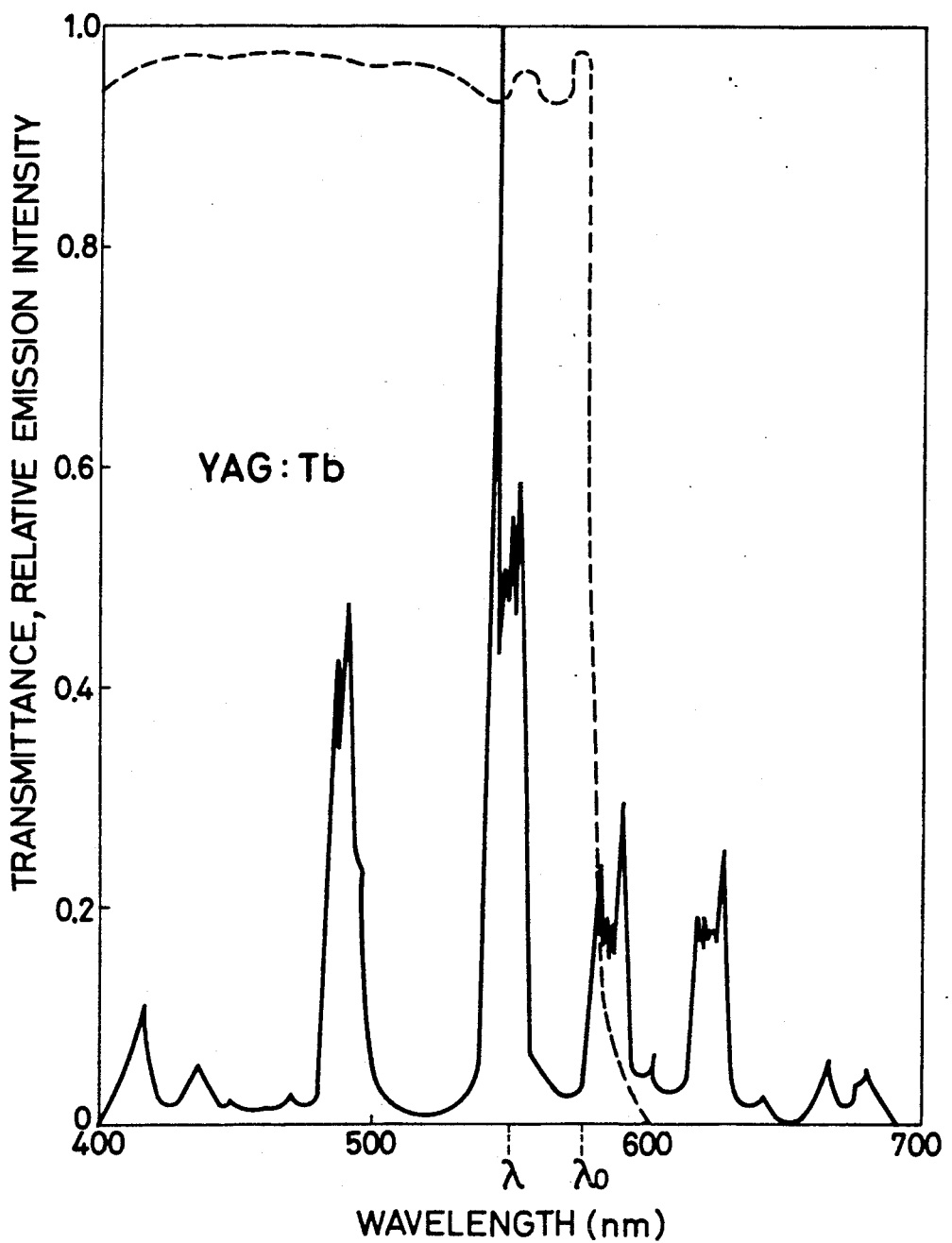
FIG. 11 is a graph showing a relative emission intensity (indicated by a solid line) of a phosphor (YAG : Tb) and spectral characteristics of a conventional optical interference filter having spectral characteristics indicated by a broken line, in which $\lambda_O$ represents a cutoff wavelength of the optical interference filter and $\lambda$ represents a center wavelength of the phosphor (YAG Tb).

The cutoff wavelength $\lambda_O$ of the optical interference filter 7 corresponds to a cutoff wavelength of an edge filter indicated by a dotted line in FIG. 11 and is selected to be larger than the center wavelength $\lambda$ of an emission spectrum of the phosphor. Since the center wavelength $\lambda$ of the emission spectrum of the phosphor can be located in the transmission band of the optical interference filter 7 by increasing the design wavelength $\lambda_O$ of the cutoff wavelength so as to be larger than the center wavelength $\lambda$ of the emission spectrum of the phosphor, emitted light from the phosphor can be transmitted outside a display window of the face plate 1. In order to obtain sharp cutoff characteristics of the optical interference filter 7 at the design wavelength $\lambda_O$, the number of stacked layers in the optical interference filter 7 is preferably an odd number of five or more.

A relationship between the cutoff wavelength $\lambda_O$ of the optical interference filter 7 and the center wavelength $\lambda$ of the emission spectrum of the phosphor is as follows. That is, $\lambda_O$ is preferably larger than 1.06$\lambda$ and smaller than 1.46$\lambda$, and most preferably, larger than 1.08$\lambda$ and smaller than 1.30$\lambda$. If $\lambda_O$ is smaller than 1.06$\lambda$, the cutoff wavelength may enter a spectral band extending from the center wavelength $\lambda$ of the emission spectrum of the phosphor to reduce a light emission amount. If $\lambda_O$ is larger than 1.46$\lambda$, a region having a large ripple in the transmission band moves closer to the center wavelength $\lambda$ of the emission spectrum and the light emitted from the phosphor layer 8 at a large emission angle from is not sufficiently cut off. In addition, since the thickness of each layer in the optical interference filter 7 is increased, $\lambda_O$ larger than 1.46 is undesirable in terms of productivity.

The number of layers alternately stacked in the optical interference filter 7 can be determined in accordance with the required optical characteristics of the optical interference filter such as a transmittance in the transmission band, a light leakage in the reflection band, and light cutoff characteristics at the cutoff wavelength $\lambda_O$. These optical characteristics can be improved as the number of layers is increased. However, if the number of layers is increased, a very long time is required to manufacture the optical interference filter, and reproducibility in the manufacture of the optical interference filter is reduced since more precise optical thickness control is required. For this reason, the number of layers constituting the periodically alternating layer 6 or 16 is preferably seven to 31, and more preferably, 13 to 23.

The low-refractive index layers 32 and 45 consisting of or consisting essentially of Al$_2$O$_3$ of the above optical interference filter 7 prevents the optical interference filter 7 from being colored upon radiation of an electron beam or X rays. The low-refractive index layers 32 and 45 consisting of or consisting essentially of Al$_2$O$_3$ give a wavelength selectivity to the optical interference filter 7 by an optical interference effect based on a refractive index difference with respect to the high-refractive index layers 33 and 34 consisting of or consisting essentially of $TiO_2$.

Each of the optical interference filters described above can be manufactured by a vacuum vapor deposition method in which each material described above is coated on the inner surface of a heated face plate for cathode-ray tube with an electron beam heating method by using a vacuum vapor deposition apparatus, comprising a conventional optical monitor for controlling a $\frac{1}{4}$-wavelength optical thickness.

The type of phosphor for use in the phosphor layer 8 of the face plate 1 for cathode-ray tube in the above Embodiments is not particularly limited. Examples of a known phosphor are yttrium aluminum garnet terbium (YAG:Tb) as a green phosphor, a europium activated yttrium oxide ($Y_2O_3$:EU) as a red phosphor, and a zinc silver sulfide (ZnS:Ag) as a blue phosphor. Although the plate 10 is not particularly limited as long as it is a known glass plate, an X-ray absorptive plate is preferable for the sake of safety to a human body upon image display.

In addition, when oxide layers consisting of, e.g., $TiO_2$ and oxide layers consisting of, e.g., $Al_2O_3$ are alternately stacked on the inner surface of a glass plate as the high- and low-refractive index layers of the optical interference filter, each layer is preferably an oxide layer coated by evaporating an oxide to be formed into the oxide layer or an element to be oxidized into the oxide on the inner surface and formed by radiating $O_2$ ions on the inner surface of the plate in a reduced-pressure atmosphere containing $O_2$.

A practical apparatus for forming the above oxide layers to manufacture the optical interference filter of a face plate for cathode-ray tube will be described.

Figure 9:
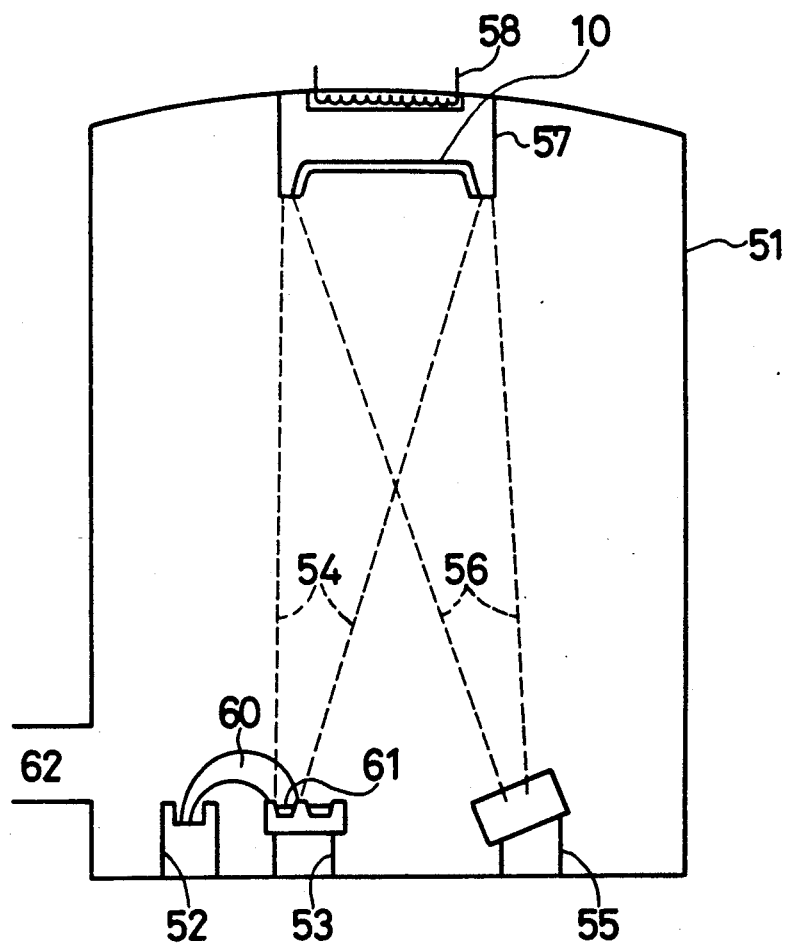
FIG. 9 is a view for explaining a practical arrangement of a vacuum vapor deposition apparatus having an $O_2$ ion radiating means for manufacturing an optical interference filter of a face plate for cathode-ray tube according to the present invention.
Figure 10A:
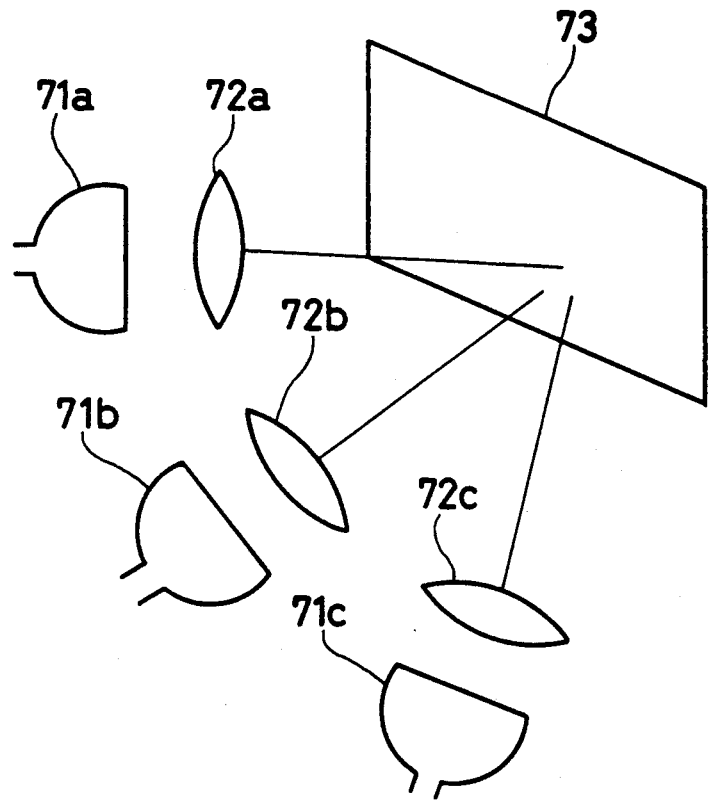
FIG. 10A is a perspective view showing a conventional projecting television set.
Figure 10B:
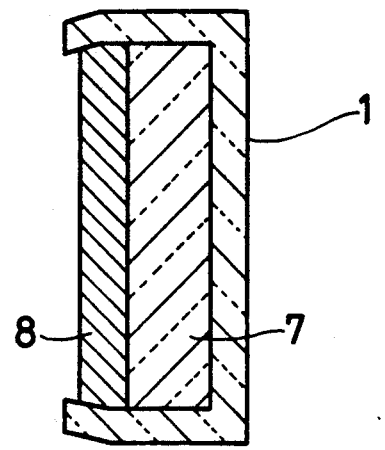
FIG. 10B is a sectional view showing a conventional face plate for cathode-ray tube.

FIG. 9 is a view for explaining a practical arrangement of an apparatus for manufacturing the optical interference filter of a face plate for cathode-ray tube. Referring to FIG. 9, a vacuum chamber 51 is evacuated by an exhaust pump (not shown) connected to an exhaust port 62. A glass plate 10 on which the optical interference filter is to be coated is supported at an upper portion of the vacuum chamber 51 by a holder 57 and heated by a heater 58 as needed. A vapor deposition material 61 charged in a crucible 53 and heated by accelerated electrons 60 emitted by an electron gun 52 arranged on a bottom portion of the chamber 51 becomes vapor flow 54 and is coated on the inner surface of the plate 10. Simultaneously, $O_2$ ions are radiated from an ion source 55 to from an $O_2$ ion beam 56, and an oxide layer constituting the optical interference filter is formed upon radiation of $O_2$ ions.

Note that the above apparatus includes a conventional optical monitor (not shown) and therefore can control a $\frac{1}{4}$-wavelength optical thickness of the oxide layer to be formed.

In a means 55 for radiating $O_2$ ions on the layer coated as described above, a cold cathode type ion source disclosed in Society of Vacuum Coaters, Proceedings of the 27th Annual Technical Conference, PP. 76 to 83, an end hole type ion source disclosed in U.S. Pat. No. 4,684,848, or a large-current plasma ion source disclosed in U.S. Pat. No. 4,448,802 can be used. In addition, in order to form an oxide serving as a layer upon stacking of oxide layers, a PVD method such as a method of depositing an oxide by heating by an electron gun or resistance heating, a sputtering method using an element to be formed into an oxide or a target of an oxide, an arc vapor deposition method, or an ion beam sputtering method can be used.

An $O_2$ partial pressure in the reduced-pressure $O_2$ atmosphere is preferably 0.013 to 0.09 Pa, and more preferably, 0.026 to 0.054 Pa. If the $O_2$ partial pressure is lower than 0.013 Pa, an evaporation substance is thermally decomposed during evaporation to reduce an oxygen amount in stacked layers, and the layers undesirably become light absorptive. If the $O_2$ partial pressure is higher than 0.09 Pa, the density of the stacked layers is undesirably decreased. When the periodically alternating layer described above is to be coated, the face plate for cathode-ray tube is preferably heated up to 100° C. to 250° C. If the temperature is lower than 100° C. or higher than 250° C., an electron beam coloring resistance of the stacked layers is slightly reduced although not significantly. An energy of $O_2$ ions to be radiated on layers upon formation of oxide layers is normally 30 to 2,000 eV, and preferably, 300 to 2,000 eV. In this case, an ion current density of radiated $O_2$ ions is 5 μA to 1 mA, and preferably 10 to 100 μA.

As described above, since reaction-active $O_2$ ions are radiated on oxide layers constituted by alternately stacked high- and low-refractive index layers when the layers are coated, a stoichiometric composition is obtained in the layers. In addition, since layers are deposited while sputtering is slightly performed on the surface layer upon coating of the layers, dense layers having a few pores can be stacked. Therefore, the stacked layers are not colored nor degraded upon radiation of an electron beam.

Samples of the above face plates for cathode-ray tube shown in FIGS. 1 to 4 were manufactured as Examples 1 to 10 to be described below.

Samples in Examples 1, 2, 3, 7 and 10 have the same structure as that of the face plate for cathode-ray tube shown in FIG. 1, samples in Examples 4, 5 and 6 have the same structure as that of the face plate for cathode-ray tube shown in FIG. 2, a sample in Example 8 has the same structure as that of the face plate for cathode-ray tube shown in FIG. 3, and a sample in Example 9 has the same structure as that of the face plate for cathode-ray tube shown in FIG. 4.

The samples in Examples 7 and 10 were manufactured by using a vacuum vapor deposition apparatus having an $O_2$ ion radiating means as shown in FIG. 9.

EXAMPLE 1

In a vacuum vapor deposition chamber, a plate for projecting cathode-ray tube having a diagonal length of seven inches and a glass plate having a thickness of 1.1 mm and a diameter of 30 mm were set on a rotary jig and heated up to 300° C., and a vacuum vapor deposition chamber was evacuated to a pressure of $6.7 \times 10^{-4}$ Pa. Granular $SiO_2$, $Al_2O_3$ and $TiO_2$ pellets were filled in different water-cooled crucibles for electron beam heating, and a gas supply valve was externally adjusted to supply oxygen into the vacuum tank to perform vapor deposition at a predetermined oxygen partial pressure. The oxygen partial pressure was adjusted to be $4.0 \times 10^{-2}$ Pa upon coating of a $TiO_2$ film and to be $1.3 \times 10^{-2}$ Pa upon coating of an $Al_2O_3$ film, thereby obtaining a sample having a film arrangement for a green phosphor shown in Table 1. When the $Al_2O_3$ film was coated, a $\frac{1}{4}$-wavelength film thickness was controlled by using an optical monitor using monochromatic light having a wavelength of 544 nm, and a film thickness of 20 nm was controlled by using a quartz oscillator. When the SiO₂ and TiO₂ films were coated, film thickness control was performed by using an optical monitor using monochromatic light having a wavelength of 688 nm and that having a wavelength of 644 nm.

TABLE 1

| Layer | Film Material | Optical Thickness (nm) |
|---|---|---|
| (Phosphor Layer Side) | | |
| 1 | $Al_2O_3$ | 292 |
| 2 | $SiO_2$ | 86 |
| 3 | $TiO_2$ | 172 |
| 4 | $SiO_2$ | 170 |
| 5 | $TiO_2$ | 168 |
| 6 | $SiO_2$ | 166 |
| 7 | $TiO_2$ | 164 |
| 8 | $SiO_2$ | 164 |
| 9 | $TiO_2$ | 163 |
| 10 | $SiO_2$ | 162 |
| 11 | $TiO_2$ | 162 |
| 12 | $SiO_2$ | 161 |
| 13 | $TiO_2$ | 162 |
| 14 | $SiO_2$ | 162 |
| 15 | $TiO_2$ | 162 |
| 16 | $SiO_2$ | 163 |
| 17 | $TiO_2$ | 164 |
| 18 | $SiO_2$ | 166 |
| 19 | $TiO_2$ | 168 |
| 20 | $SiO_2$ | 170 |
| 21 | $TiO_2$ | 172 |
| (Plate Inner Surface Side) | | |

Figure 5:
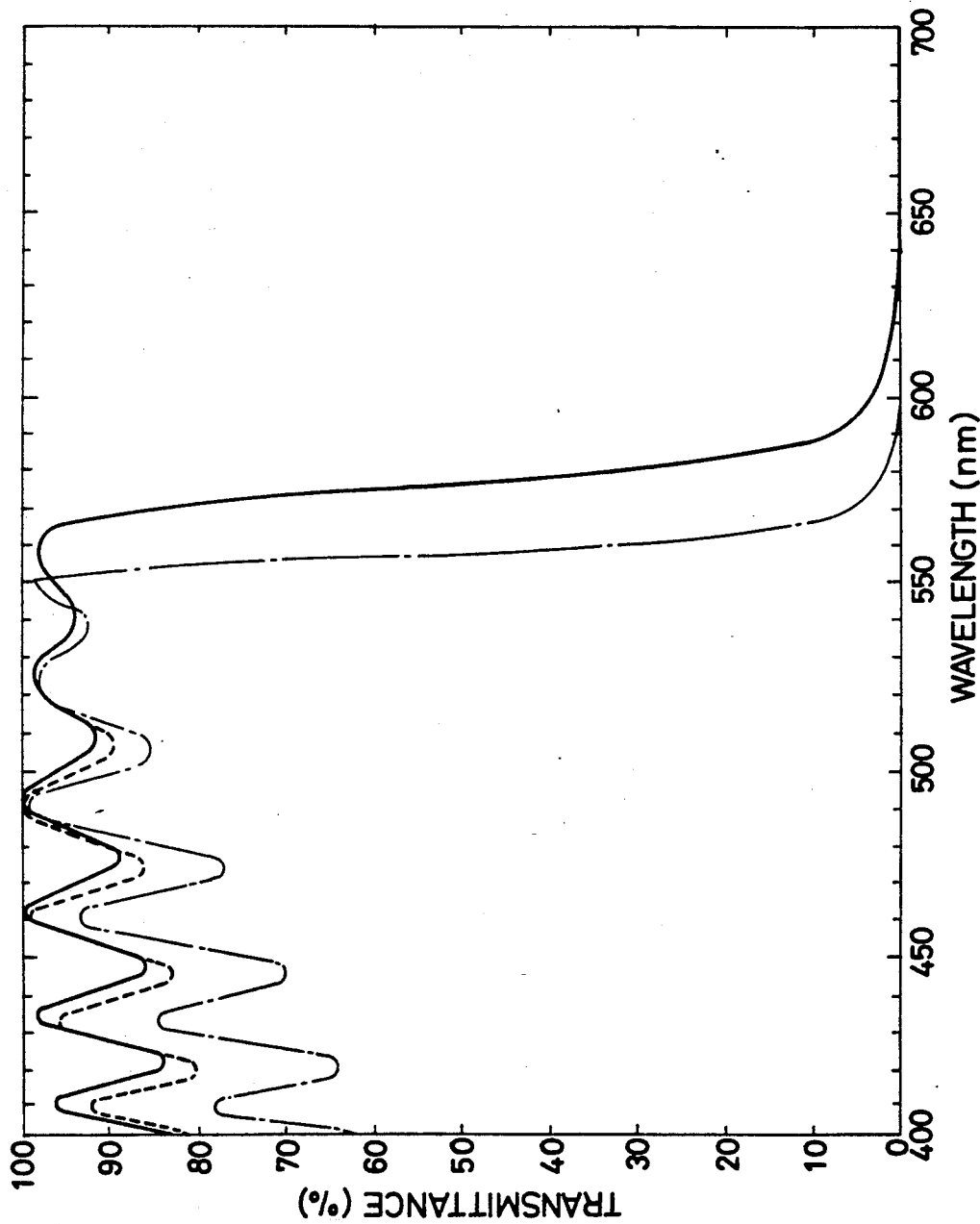
FIG. 5 is a graph showing, in Examples 1, 2 and 3 of a face plate for cathode-ray tube according to the present invention, spectral characteristics of glass plates on which the same optical interference filters as that of the face plate for cathode-ray tube are formed, in which the spectral characteristics are indicated by a broken line, a chain line with one dot, and a full line for Examples 1, 2 and 3, respectively.

The obtained face plate for cathode-ray tube was cleaned by spraying a 5% aqueous solution of hydrofluoric acid at a temperature of 20° C. from a nozzle for 20 seconds and sufficiently washed with water, and the state of an optical interference filter was checked. The check result is shown in Table 8. As apparent from Table 8, no abnormality was found in the optical interference filter. A green phosphor was adhered on the optical interference filter of this sample by using water glass to obtain a phosphor coated surface having practically no pinholes. In addition, a bright projected image was obtained with a good directivity by a projecting tube using this face plate for cathode-ray tube. As is apparent from results obtained by an electron beam browning test shown in Table 9, the optical interference filter was not colored. The optical characteristic of a glass plate covered with the optical interference filter is indicated by a broken line in FIG. 5.

EXAMPLE 2

Following the same procedures as in Example 1 except that $ZrO_2$ was used in place of $Al_2O_3$, an optical interference filter for a green phosphor having a film arrangement shown in Table 2 was coated on the inner surface of a plate for projecting cathode-ray tube having a diagonal length of seven inches and on a glass plate having a diameter of 30 mm. The obtained sample of the face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 8. As is apparent from Table 8, no abnormality was found in the optical interference filter according to the present invention. A phosphor was adhered on the optical interference filter of this sample by using water glass to obtain a green phosphor coated surface practically having no pinholes. When a projecting tube was manufactured by using this face plate for cathode-ray tube, a bright image having a good directivity was obtained. As is apparent from Table 9 showing the results of an electron beam browning test, the optical interference filter was not colored. A spectral transmittance of the glass plate coated with the optical interference filter was measured. As a result, a high transmittance in a transmission band and good cutoff characteristics substantially the same as those in Example 1 were obtained as indicated by a chain line with one dot in FIG. 5.

TABLE 2

| Layer | Film Material | Optical Thickness (nm) |
|---|---|---|
| (Phosphor Layer Side) | | |
| 1 | $ZrO_2$ | 292 |
| 2 | $SiO_2$ | 86 |
| 3 | $TiO_2$ | 172 |
| 4 | $SiO_2$ | 170 |
| 5 | $TiO_2$ | 168 |
| 6 | $SiO_2$ | 166 |
| 7 | $TiO_2$ | 164 |
| 8 | $SiO_2$ | 164 |
| 9 | $TiO_2$ | 163 |
| 10 | $SiO_2$ | 162 |
| 11 | $TiO_2$ | 162 |
| 12 | $SiO_2$ | 161 |
| 13 | $TiO_2$ | 162 |
| 14 | $SiO_2$ | 162 |
| 15 | $TiO_2$ | 162 |
| 16 | $SiO_2$ | 163 |
| 17 | $TiO_2$ | 164 |
| 18 | $SiO_2$ | 166 |
| 19 | $TiO_2$ | 168 |
| 20 | $SiO_2$ | 170 |
| 21 | $TiO_2$ | 172 |
| (Plate Inner Surface Side) | | |

EXAMPLE 3

Following the same procedures as in Example 1 except that $Al_2O_3$ was used in place of $SiO_2$, an optical interference filter for a green phosphor having a film arrangement shown in Table 3 was coated on the inner surface of a plate for projecting cathode-ray tube having a diagonal length of seven inches and on a glass plate having a diameter of 30 mm. Note that an optical thickness of an $Al_2O_3$ layer in contact with a phosphor layer shown in Table 3 is the sum of the optical thicknesses of the $Al_2O_3$ layer 5 and the low-refractive index layer 2 shown in FIG. 1.

TABLE 3

| Layer | Film Material | Optical Thickness (nm) |
|---|---|---|
| (Phosphor Layer Side) | | |
| 1 | $Al_2O_3$ | 378 |
| 2 | $TiO_2$ | 172 |
| 3 | $Al_2O_3$ | 170 |
| 4 | $TiO_2$ | 168 |
| 5 | $Al_2O_3$ | 166 |
| 6 | $TiO_2$ | 164 |
| 7 | $Al_2O_3$ | 164 |
| 8 | $TiO_2$ | 163 |
| 9 | $Al_2O_3$ | 162 |
| 10 | $TiO_2$ | 162 |
| 11 | $Al_2O_3$ | 161 |
| 12 | $TiO_2$ | 162 |
| 13 | $Al_2O_3$ | 162 |
| 14 | $TiO_2$ | 162 |
| 15 | $Al_2O_3$ | 163 |
| 16 | $TiO_2$ | 164 |
| 17 | $Al_2O_3$ | 166 |
| 18 | $TiO_2$ | 168 |
| 19 | $Al_2O_3$ | 170 |
| 20 | $TiO_2$ | 172 |

TABLE 3-continued

| Layer | Film Material | Optical Thickness (nm) |
|---|---|---|
| (Plate Inner Surface Side) | | |

The obtained face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 8. As is apparent from Table 8, no abnormality was found in the optical interference filter. A green phosphor was adhered on the optical interference filter of this sample by using water glass to obtain a phosphor coated surface practically having no pinholes. A bright projected image having a good directivity was obtained by a projecting tube using this face plate for cathode-ray tube. As is apparent from the results of an electron beam browning test shown in Table 9, the optical interference filter was not colored. The optical characteristic of the glass plate covered with the optical interference filter is indicated by a full line in FIG. 5.

EXAMPLE 4

In a vacuum vapor deposition apparatus, a plate for projecting cathode-ray tube having a diagonal length of seven inches and a glass plate having a diameter of 30 mm were set on a rotary jig and heated up to 300° C., and a vacuum chamber was evacuated to a pressure of $6.7 \times 10^{-4}$ Pa. Granular $SiO_2$, $Al_2O_3$ and $TiO_2$ pellets were filled in different water-cooled crucibles for electron beam heating, and a gas supply valve was externally adjusted to supply oxygen into the vacuum chamber, thereby performing vapor deposition at a predetermined oxygen partial pressure. The oxygen partial pressure was adjusted to be $4.0 \times 10^{-2}$ Pa upon coating of a $TiO_2$ film and to be $1.3 \times 10^{-2}$ Pa upon coating of an $Al_2O_3$ film to obtain a sample for a green phosphor having a film arrangement as shown in Table 4. Upon coating of the $Al_2O_3$ layer, a film having a ½-wavelength film thickness was coated by using an optical monitor using 544-nm wavelength monochromatic light, and a film having a thickness of 20 nm was $SiO_2$ and $TiO_2$ layers having an optical thickness of 165 nm, film thickness control was performed by using an optical monitor using 660-nm wavelength monochromatic light. Upon coating of $TiO_2$ layer having an optical thickness of 218.5 nm, film thickness control was performed by using an optical monitor using 544-nm wavelength monochromatic light.

The obtained sample of the face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 8. As is apparent from Table 8, no abnormality was found in the optical interference filter. When a phosphor was adhered on the optical interference filter of this sample by using water glass, a phosphor coated surface practically having no pinholes was obtained. A projecting tube using this face plate for cathode-ray tube exhibited a high brightness and a good projecting light directivity.

TABLE 4

| Layer | Film Material | Optical Thickness (nm) |
|---|---|---|
| (Phosphor Layer Side) | | |
| 1 | $Al_2O_3$ | 292 |
| 2 | $TiO_2$ | 218.5 |
| 3 | $SiO_2$ | 165 |
| 4 | $TiO_2$ | 165 |
| 5 | $SiO_2$ | 165 |
| 6 | $TiO_2$ | 165 |
| 7 | $SiO_2$ | 165 |
| 8 | $TiO_2$ | 165 |
| 9 | $SiO_2$ | 165 |
| 10 | $TiO_2$ | 165 |
| 11 | $SiO_2$ | 165 |
| 12 | $TiO_2$ | 165 |
| 13 | $SiO_2$ | 165 |
| 14 | $TiO_2$ | 165 |
| 15 | $SiO_2$ | 165 |
| 16 | $TiO_2$ | 165 |
| 17 | $SiO_2$ | 165 |
| 18 | $TiO_2$ | 165 |
| 19 | $SiO_2$ | 165 |
| 20 | $TiO_2$ | 165 |
| 21 | $SiO_2$ | 165 |
| 22 | $TiO_2$ | 218.5 |
| (Plate Inner Surface Side) | | |

As is apparent from the result of an electron beam browning test shown in Table 9, the optical interference filter was not colored. The spectral transmission characteristic of the optical interference filter coated on the glass plate is indicated by a broken line shown in FIG. 6.

EXAMPLE 5

Following the same procedures as in Example 4 except that $ZrO_2$ was used in place of $Al_2O_3$, an optical interference filter for a green phosphor having a film arrangement shown in Table 5 was coated on the inner surface of a plate for projecting cathode-ray tube having a diagonal length of seven inches and on a glass plate having a diameter of 30 mm. The obtained sample of the face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 8. As is apparent from Table 8, no abnormality such as a pinhole or peeling was found in the optical interference filter. A phosphor was adhered on the optical interference filter of this sample to obtain a phosphor coated surface practically having no pinholes. A projecting tube using this face plate for cathode-ray tube exhibited a high brightness and a good projecting light directivity. As is apparent from the result of an electron beam browning test shown in Table 9, the optical interference filter was not colored.

TABLE 5

| Layer | Film Material | Optical Thickness (nm) |
|---|---|---|
| (Phosphor Layer Side) | | |
| 1 | $ZrO_2$ | 292 |
| 2 | $TiO_2$ | 218.5 |
| 3 | $SiO_2$ | 165 |
| 4 | $TiO_2$ | 165 |
| 5 | $SiO_2$ | 165 |
| 6 | $TiO_2$ | 165 |
| 7 | $SiO_2$ | 165 |
| 8 | $TiO_2$ | 165 |
| 9 | $SiO_2$ | 165 |
| 10 | $TiO_2$ | 165 |

TABLE 5-continued

| Layer | Film Material | Optical Thickness (nm) |
|---|---|---|
| 11 | SiO$_2$ | 165 |
| 12 | TiO$_2$ | 165 |
| 13 | SiO$_2$ | 165 |
| 14 | TiO$_2$ | 165 |
| 15 | SiO$_2$ | 165 |
| 16 | TiO$_2$ | 165 |
| 17 | SiO$_2$ | 165 |
| 18 | TiO$_2$ | 165 |
| 19 | SiO$_2$ | 165 |
| 20 | TiO$_2$ | 165 |
| 21 | SiO$_2$ | 165 |
| 22 | TiO$_2$ | 218.5 |
| (Plate Inner Surface Side) | | |

Figure 6:
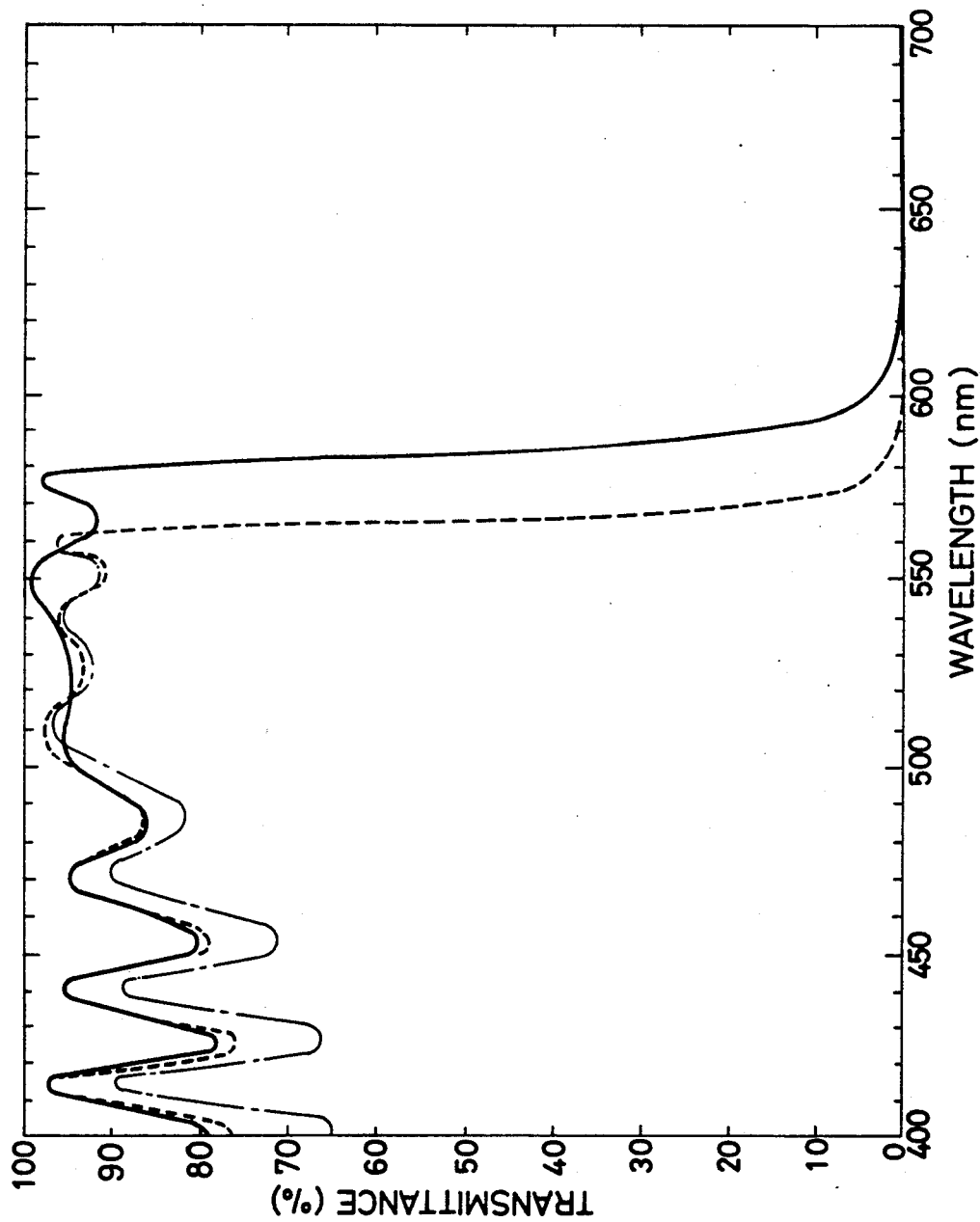
FIG. 6 is a graph showing, in Examples 4, 5 and 7 of a face plate for cathode-ray tube according to present invention, spectral characteristics of glass plates on which the same optical interference filters as that of the face plate for cathode-ray tube are formed, in which the spectral characteristics are indicated by a broken line, a chain line with one dot, and a full line for Examples 4, 5 and 7, respectively.

The spectral transmission characteristic of the optical interference filter coated on the glass plate is indicated by a chain line with one dot in FIG. 6.

EXAMPLE 6

Following the same procedures as in Example 4 except that Al$_2$O$_3$ was used in place of SiO$_2$, an optical interference filter for a green phosphor having a film arrangement shown in Table 6 was coated on the inner surface of a plate for projecting cathode-ray tube having a diagonal length of seven inches and on a glass plate having a diameter of 30 mm. The obtained sample of the face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 8. As is apparent from Table 8, no abnormality such as a pinhole or peeling was found in the optical interference filter. A phosphor was adhered on the optical interference filter of this sample by using water glass to obtain a phosphor coated surface practically having no pinholes. A projecting tube using this face plate for cathode-ray tube directivity. As is apparent from the result of an electron beam browning test shown in Table 9, the optical interference filter was not colored.

TABLE 6

| Layer | Film Material | Optical Thickness (nm) |
|---|---|---|
| (Phosphor Layer Side) | | |
| 1 | Al$_2$O$_3$ | 292 |
| 2 | TiO$_2$ | 218.5 |
| 3 | Al$_2$O$_3$ | 165 |
| 4 | TiO$_2$ | 165 |
| 5 | Al$_2$O$_3$ | 165 |
| 6 | TiO$_2$ | 165 |
| 7 | Al$_2$O$_3$ | 165 |
| 8 | TiO$_2$ | 165 |
| 9 | Al$_2$O$_3$ | 165 |
| 10 | TiO$_2$ | 165 |
| 11 | Al$_2$O$_3$ | 165 |
| 12 | TiO$_2$ | 165 |
| 13 | Al$_2$O$_3$ | 165 |
| 14 | TiO$_2$ | 165 |
| 15 | Al$_2$O$_3$ | 165 |
| 16 | TiO$_2$ | 165 |
| 17 | Al$_2$O$_3$ | 165 |
| 18 | TiO$_2$ | 165 |
| 19 | Al$_2$O$_3$ | 165 |
| 20 | TiO$_2$ | 165 |
| 21 | Al$_2$O$_3$ | 165 |
| 22 | TiO$_2$ | 218.5 |
| (Plate Inner Surface Side) | | |

EXAMPLE 7

A Kaufman type ion gun was arranged near the electron gun for vapor deposition arranged on the bottom portion of the vacuum vapor deposition apparatus used in Example 1, and a gas was supplied in this ion gun at an externally controlled flow rate so that gas ions generated in the ion gun could be accelerated and radiated on a plate on which a film was being coated. Following the same procedures as in Example 1 except that 10 SCCM of oxygen was supplied in the ion gun upon coating of TiO$_2$, Al$_2$O$_3$ and SiO$_2$ films and generated oxygen ions were radiated on the surface of a face plate at an ion energy of 1,000 eV and an ion current density of 100 $\mu$A/cm$^2$, an optical interference filter for a green phosphor having a film arrangement shown in Table 1 was coated on the inner surface of a plate for projecting cathode-ray tube having a diagonal length of seven inches and on a glass plate having a diameter of 30 mm. The obtained sample of the face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 8. As is apparent from Table 8, no abnormality was found in the optical interference filter. A phosphor was adhered on the optical interference filter of this sample by using water glass to obtain a green phosphor coated surface practically having no pinholes. When a projecting tube was manufactured by using this face plate for cathode-ray tube, a bright image with a good directivity was obtained. As is apparent from the result of an electron beam browning test shown in Table 9, the optical interference filter was not colored. The spectral transmittance of the glass plate covered with the optical interference filter was measured. As a result, as indicated by a chain line with one dot in FIG. 5, a high transmittance in a transmission band and good wavelength cutoff characteristics substantially the same as those in Example 1 were obtained.

TABLE 8

| Sample | Item State of Optical Interference Filter After Hydrofluoric Acid Cleaning |
|---|---|
| Example 1 | No outer appearance change was found. |
| Example 2 | No outer appearance change was found. |
| Example 3 | No outer appearance change was found. |
| Example 4 | No outer appearance change was found. |
| Example 5 | No outer appearance change was found. |
| Example 6 | No outer appearance change was found. |
| Example 7 | No outer appearance change was found. |
| Comparative Example 1 | A film was partially removed, and a reduction in film thickness was significant. |

TABLE 9

| Sample | Electron Beam Browning Test by Raster Pattern (Colored State of Optical Interference Filter after Electron Beam Radiation for 30 Min) |
|---|---|
| Example 1 | No coloring was found throughout the entire surface. |
| Example 2 | No coloring was found throughout the entire surface. |
| Example 3 | No coloring was found throughout the entire surface. |
| Example 4 | No coloring was found throughout the entire surface. |
| Example 5 | No coloring was found throughout the |

TABLE 9-continued

| Sample | Electron Beam Browning Test by Raster Pattern (Colored State of Optical Interference Filter after Electron Beam Radiation for 30 Min) |
| --- | --- |
| | entire surface. |
| Example 6 | No coloring was found throughout the entire surface. |
| Example 7 | No coloring was found throughout the entire surface. |
| Comparative Example 1 | An electron beam irradiated portion was yellowed. |

(Conditions: electron beam acceleration voltage = 30 kV, electron current = 350 μA, raster size = 102 × 76 mm$^2$)

The spectral transmission characteristic of the optical interference filter coated on the glass plate is indicated by a full line in FIG. 6.

COMPARATIVE EXAMPLE 1

In the same vacuum vapor deposition apparatus as in Example 1, a plate for projecting cathode-ray tube having a diagonal length of seven inches was set on a rotary jig and heated up to 300° C., and a vacuum tank was evacuated to a pressure of $6.7 \times 10^{-4}$ Pa. The oxygen partial pressure was adjusted to be $1.3 \times 10^{-2}$ Pa upon coating of an SiO$_2$ film and to be $4.0 \times 10^{-2}$ Pa upon coating of a TiO$_2$ film, thereby coating an optical interference filter for a green phosphor having a film arrangement shown in Table 7. The obtained sample was cleaned by spraying a 5% aqueous hydrofluoric acid solution at a temperature of 20° C. from a nozzle for 20 seconds and washed with water. As a result, as shown in Table 8, a reduction in film thickness of the optical interference filter was found, and the film was partially peeled. Table 9 shows the result of an electron beam browning test. A portion of the optical interference filter irradiated with an electron beam was yellowed.

TABLE 7

| Layer | Film Material | Optical Thickness (nm) |
| --- | --- | --- |
| (Phosphor Layer Side) | | |
| 1 | SiO$_2$ | 86 |
| 2 | TiO$_2$ | 172 |
| 3 | SiO$_2$ | 170 |
| 4 | TiO$_2$ | 168 |
| 5 | SiO$_2$ | 166 |
| 6 | TiO$_2$ | 164 |
| 7 | SiO$_2$ | 164 |
| 8 | TiO$_2$ | 163 |
| 9 | SiO$_2$ | 162 |
| 10 | TiO$_2$ | 162 |
| 11 | SiO$_2$ | 161 |
| 12 | TiO$_2$ | 162 |
| 13 | SiO$_2$ | 162 |
| 14 | TiO$_2$ | 162 |
| 15 | SiO$_2$ | 163 |
| 16 | TiO$_2$ | 164 |
| 17 | SiO$_2$ | 166 |
| 18 | TiO$_2$ | 168 |
| 19 | SiO$_2$ | 170 |
| 20 | TiO$_2$ | 172 |
| (Plate Inner Surface Side) | | |

The optical interference filter can be cleaned with hydrofluoric acid by setting a cutoff wavelength to be, e.g., 540 nm when a phosphor is blue (i.e., when a center wavelength of emission is 450 nm) and to be, e.g., 740 nm when a phosphor is red (i.e., when a center wavelength of emission is, e.g., 612 nm). As a result, blue and red face plates for cathode-ray tube, in which a high adhesive force is obtained between a phosphor and the optical interference filter and which practically has no pinholes, can be obtained.

The optical interference filter of the face plate for cathode-ray tube according to each of Examples 1 to 7 described above does not cause a browning phenomenon upon radiation of an electron beam. Therefore, a bright image can be projected by using this optical interference filter in a projecting tube of a projection type television set. In addition, since the optical interference filter has a high adhesive force with respect to a phosphor layer, it essentially has no small pinholes. Since the number or size of pinholes is not increased as the time passes, an image free from defects can be obtained with high reliability. Furthermore, a face plate for cathode-ray tube can be manufactured with high operability since cleaning of the face plate for cathode-ray tube and cleaning of the surface of the optical interference filter can be performed by using the same cleaning solution.

EXAMPLE 8

In a vacuum vapor deposition apparatus, a plate for projecting cathode-ray tube having a diagonal length of seven inches and a glass plate having a thickness of 1.1 mm and a diameter of 30 mm were set on a rotary jig and heated up to 300° C., and a vacuum chamber was evacuated to $6.7 \times 10^{-4}$ Pa. Granular Al$_2$O$_3$ and TiO$_2$ sintered pellets were filled in different water-cooled crucible for electron beam heating, and a gas supply valve was externally adjusted to supply oxygen into the vacuum tank, thereby performing vapor deposition at a predetermined oxygen partial pressure. The oxygen partial pressure was adjusted to be $4.0 \times 10^{-2}$ Pa upon coating of a TiO$_2$ film and to be $1.3 \times 10^{-2}$ Pa upon coating of an Al$_2$O$_3$ film. Film control was performed in accordance with so-called ¼ wavelength control of an optical monitor using monochromatic light having wavelengths of 640 nm and 648 nm for coating of a TiO$_2$ layer and an Al$_2$O$_3$ layer having an optical thickness of 160 nm and for coating of a TiO$_2$ layer having an optical thickness of 216 nm, respectively.

Figure 7:
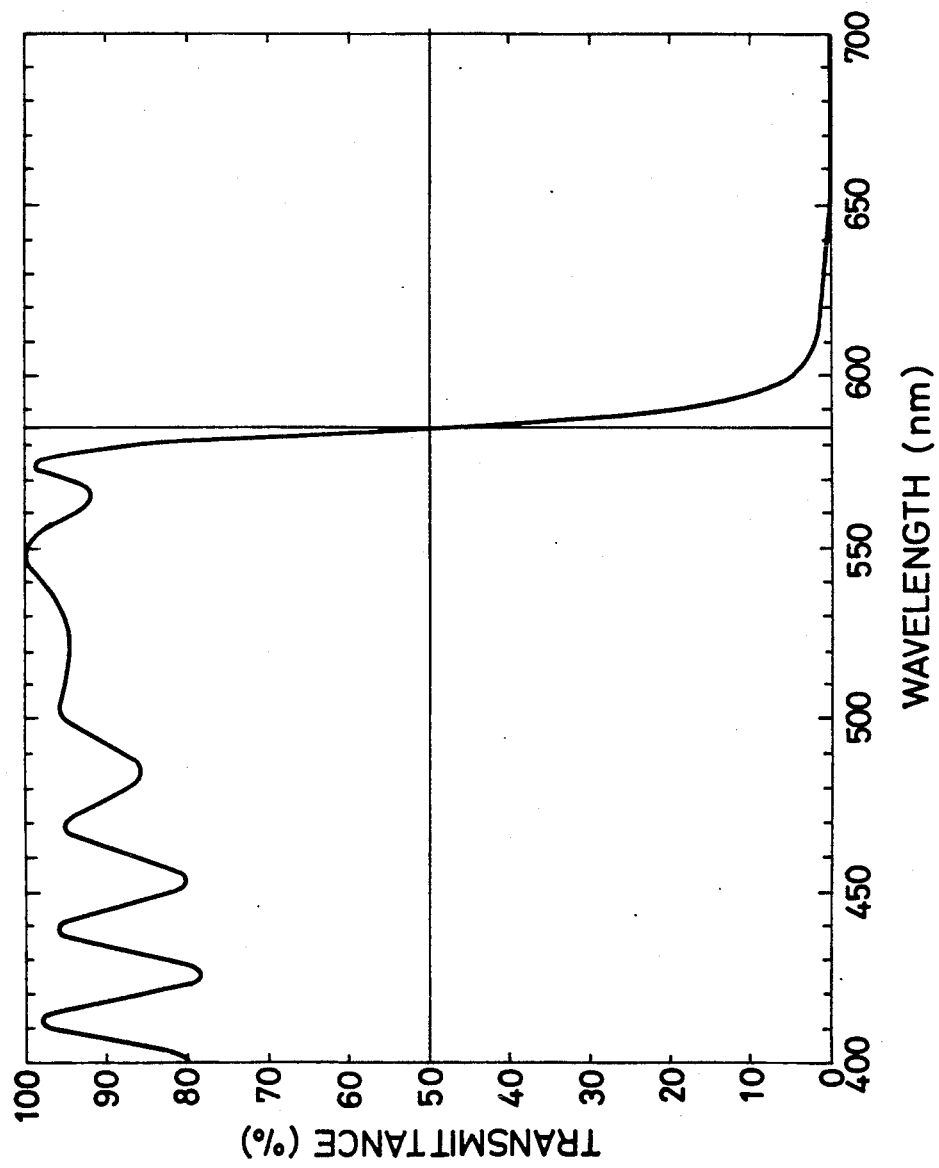
FIG. 7 is a graph showing, in Example 8 of a face plate for cathode-ray tube according to the present invention, spectral characteristics of a glass plate on which the same optical interference filter as that of the face plate for cathode-ray tube is formed.

By alternately coating the TiO$_2$ and Al$_2$O$_3$ layers having the above optical thicknesses, an optical interference filter having a film arrangement shown in Table 10 and can be applied to a projecting type in which an emission center of a phosphor is 544 nm was manufactured. The glass plate set on the rotary jig together with the plate was removed from the vacuum apparatus, and the spectral transmission characteristic was measured. The measurement result is shown in FIG. 7.

A green YAG:Tb phosphor having an emission center of 550 nm was adhered on the optical interference filter of the obtained face plate for cathode-ray tube by using water glass to obtain a phosphor coated layer practically having no pinholes. A bright projected image with a good directivity was obtained by a projecting tube using this face plate for cathode-ray tube. As is apparent from the result of an electron beam browning test as shown in Table 11, a coloring resistance of the optical interference filter was high.

TABLE 10

| Layer | Film Material | Optical Thickness (nm) |
| --- | --- | --- |
| (Phosphor Layer Side) | | |
| 1 | TiO$_2$ | 216 |
| 2 | Al$_2$O$_3$ | 160 |
| 3 | TiO$_2$ | 160 |

TABLE 10-continued

| Layer | Film Material | Optical Thickness (nm) |
| --- | --- | --- |
| 4 | $Al_2O_3$ | 160 |
| 5 | $TiO_2$ | 160 |
| 6 | $Al_2O_3$ | 160 |
| 7 | $TiO_2$ | 160 |
| 8 | $Al_2O_3$ | 160 |
| 9 | $TiO_2$ | 160 |
| 10 | $Al_2O_3$ | 160 |
| 11 | $TiO_2$ | 160 |
| 12 | $Al_2O_3$ | 160 |
| 13 | $TiO_2$ | 160 |
| 14 | $Al_2O_3$ | 160 |
| 15 | $TiO_2$ | 160 |
| 16 | $Al_2O_3$ | 160 |
| 17 | $TiO_2$ | 160 |
| 18 | $Al_2O_3$ | 160 |
| 19 | $TiO_2$ | 160 |
| 20 | $Al_2O_3$ | 160 |
| 21 | $TiO_2$ | 216 |
| (Plate Inner Surface Side) | | |

TABLE 11

Test Item
Electron Beam Browning Test[1] by Raster Pattern (Colored State[2]) of Optical Interference Filter after Electron Beam Radiation

| Sample | Electron Beam Radiation Time | | |
| --- | --- | --- | --- |
| | 3 Min | 5 Min | 10 Min |
| Example 8 | ○ | ○ | ○ |
| Example 9 | ○ | ○ | ○ |
| Comparative Example 2 | Δ | Δ | x |

[1]Test conditions, electron beam acceleration voltage: 30 kV, electron current: 6 mA, window pattern: 10 × 10 mm²
[2]Colored State, ○: not colored, Δ: slightly colored, x: colored

EXAMPLE 9

Following the same procedure as in Example 1, a face plate for cathode-ray tube coated with an optical interference filter having an arrangement shown in Table 12 was obtained. A green phosphor having an emission center wavelength of 550 nm was adhered on the optical interference filter of the obtained face plate for cathode-ray tube by using water glass to obtain a phosphor layer practically having no pinholes.

A bright projected image having a good directivity was obtained by a projecting tube using this face plate for cathode-ray tube. As is apparent from the result of an electron beam browning test shown in Table 11, a coloring resistance of the optical interference filter was good.

TABLE 12

| Layer | Film Material | Optical Thickness (nm) |
| --- | --- | --- |
| (Phosphor Layer Side) | | |
| 1 | $Al_2O_3$ | 100 |
| 2 | $TiO_2$ | 200 |
| 3 | $Al_2O_3$ | 198 |
| 4 | $TiO_2$ | 197 |
| 5 | $Al_2O_3$ | 194 |
| 6 | $TiO_2$ | 192 |
| 7 | $Al_2O_3$ | 190 |
| 8 | $TiO_2$ | 188 |
| 9 | $Al_2O_3$ | 186 |
| 10 | $TiO_2$ | 186 |
| 11 | $Al_2O_3$ | 185 |
| 12 | $TiO_2$ | 186 |
| 13 | $Al_2O_3$ | 186 |
| 14 | $TiO_2$ | 187 |
| 15 | $Al_2O_3$ | 188 |
| 16 | $TiO_2$ | 190 |
| 17 | $Al_2O_3$ | 192 |
| 18 | $TiO_2$ | 195 |
| 19 | $Al_2O_3$ | 198 |
| 20 | $TiO_2$ | 201 |
| 21 | $Al_2O_3$ | 100 |
| (Plate Inner Surface Side) | | |

COMPARATIVE EXAMPLE 2

In the same vacuum vapor deposition apparatus as in Example 1, a plate for projecting cathode-ray tube having a diagonal length of seven inches was set on a rotary jig and heated up to 300° C., and a vacuum chamber was evacuated to $6.7 \times 10^{-4}$ Pa $SiO_2$ and $TiO_2$ films were deposited at oxygen partial pressures of $1.3 \times 10^{-2}$ Pa and $4.0 \times 10^{-2}$ Pa, respectively, thereby obtaining a face plate for cathode-ray tube coated with an optical interference filter having a film arrangement shown in Table 13.

A green phosphor having an emission center wavelength of 550 nm was adhered on the optical interference filter of the obtained face plate for cathode-ray tube by using water glass to obtain a phosphor coated layer practically having no pinholes.

A bright projected image with a good directivity was obtained by a projecting tube using this face plate for cathode-ray tube. As is apparent from the result of an electron beam browning test shown in Table 11, coloring was caused by electron beam radiation in a short time period.

TABLE 13

| Layer | Film Material | Optical Thickness (nm) |
| --- | --- | --- |
| (Phosphor Layer Side) | | |
| 1 | $TiO_2$ | 218.5 |
| 2 | $SiO_2$ | 165 |
| 3 | $TiO_2$ | 165 |
| 4 | $SiO_2$ | 165 |
| 5 | $TiO_2$ | 165 |
| 6 | $SiO_2$ | 165 |
| 7 | $TiO_2$ | 165 |
| 8 | $SiO_2$ | 165 |
| 9 | $TiO_2$ | 165 |
| 10 | $SiO_2$ | 165 |
| 11 | $TiO_2$ | 165 |
| 12 | $SiO_2$ | 165 |
| 13 | $TiO_2$ | 165 |
| 14 | $SiO_2$ | 165 |
| 15 | $TiO_2$ | 165 |
| 16 | $SiO_2$ | 165 |
| 17 | $TiO_2$ | 165 |
| 18 | $SiO_2$ | 165 |
| 19 | $TiO_2$ | 165 |
| 20 | $SiO_2$ | 165 |
| 21 | $TiO_2$ | 218.5 |
| (Plate Inner Surface Side) | | |

EXAMPLE 10

In a vacuum vapor deposition apparatus, a plate for projecting cathode-ray tube having a diagonal length of seven inches and a glass plate having a thickness of 1.1 mm and a diameter of 30 mm were set on a rotary jig and heated up to 200° C., and a vacuum chamber was evacuated to a pressure of $6.7 \times 10^{-4}$ Pa Granular $Al_2O_3$ and $TiO_2$ pellets were filled in different water-cooled crucibles for electron beam heating. A Kaufman type ion source was arranged near an electron gun for vapor deposition arranged on the bottom portion of the vapor deposition apparatus, and $O_2$ was supplied in the ion source at an externally controlled flow rate so that $O_2$ ions generated in the ion source could be accelerated and radiated on the face plate during layer formation 10 SCCM of $O_2$ was supplied in the ion source, and generated $O_2$ ions were radiated on the surface of each layer stacked on the face plate at an ion energy of 1,000 eV and an ion current density of 100 $\mu A/cm^2$. An orifice valve of the vapor deposition apparatus was adjusted to set a partial pressure to be 0.04 Pa upon coating of a $TiO_2$ layer and to be 0.013 Pa upon coating of an $Al_2O_3$ layer, thereby obtaining sample 1 of a face plate for cathode-ray tube coated with the optical interference filter for a green phosphor having the same film arrangement as shown in Table 3.

Figure 8:
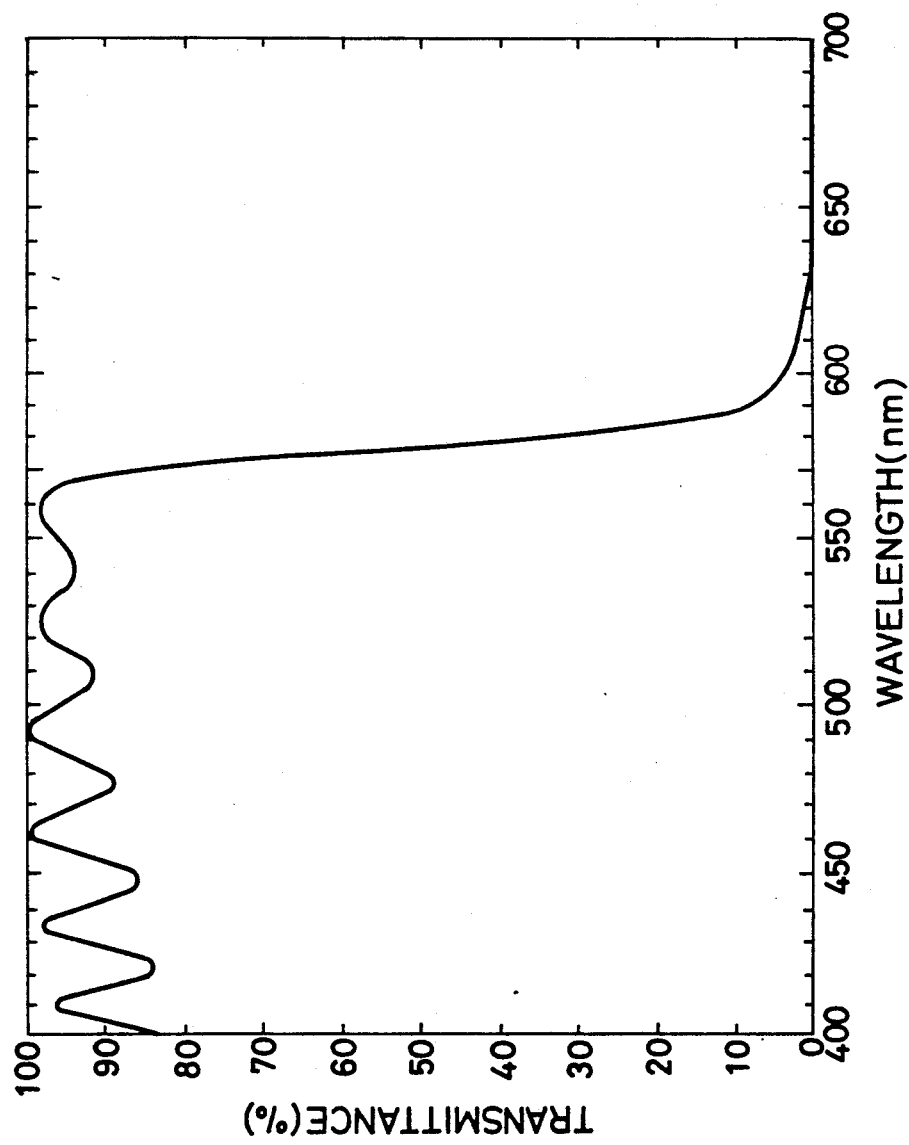
FIG. 8 is a graph showing, in Example 10 of a face plate for cathode-ray tube according to the present invention, spectral characteristics of a glass plate on which the same optical interference filter as that of the face plate for cathode-ray tube is formed.

The obtained sample 1 of the face plate for cathode-ray tube was cleaned by spraying a 5% aqueous hydrofluoric acid solution at a temperature of 20° C. from a nozzle for 20 seconds and sufficiently washed with water, and the state of the optical interference filter was checked. The check result is shown in Table 14. As is apparent from Table 14, no abnormality was found in the optical interference filter. A green phosphor was adhered on the optical interference filter of sample 1 by using water glass to obtain a phosphor coated surface practically having no pinholes. A bright projected image with a good directivity was obtained by a projecting tube using this face plate for cathode-ray tube. As is apparent from the result of an electron beam browning test shown in Table 15, the optical interference filter was not colored. The optical characteristic of the glass plate coated with the optical interference filter is indicated by a full line in FIG. 8.

Samples 2 to 6 of a face plate for cathode-ray tube were manufactured by changing the heating temperature of the face plate for cathode-ray tube and the $O_2$ partial pressure as shown in Table 16 upon coating of layers of the optical interference filter, and the state of the optical interference filter after hydrofluoric acid cleaning and the colored state of the optical interference filter after electron beam radiation were checked following the same procedures as for sample 1. The results are summarized in Tables 14 and 15.

TABLE 14

| Sample | Item State of Optical Interference Filter After Hydrofluoric Acid Cleaning |
|---|---|
| Sample 1 | No outer appearance change was found. |
| Sample 2 | No outer appearance change was found. |
| Sample 3 | No outer appearance change was found. |
| Sample 4 | No outer appearance change was found. |
| Sample 5 | No outer appearance change was found. |
| Sample 6 | No outer appearance change was found. |
| Comparative Example 3 | A film was partially peeled, and a reduction in film thickness was significant. |

TABLE 15

| Sample Name | Electron Beam Browning Test by Raster Pattern (Colored State of Optical Interference Filter after Electron Beam Radiation for 30 Min) |
|---|---|
| Sample 1 | No coloring was found throughout the entire surface. |
| Sample 2 | No coloring was found throughout the entire surface. |
| Sample 3 | No coloring was found throughout the entire surface. |
| Sample 4 | No coloring was found throughout the entire surface. |
| Sample 5 | No coloring was found throughout the entire surface. |
| Sample 6 | No coloring was found throughout the entire surface. |
| Comparative Example 3 | An electron beam irradiated portion was yellowed. |

Conditions: electron beam acceleration voltage = 30 kV, electron current = 350 $\mu A$, raster size = 102 × 76 $mm^2$

TABLE 16

| | Item Manufacturing Conditions of Optical Interference Filter | | |
|---|---|---|---|
| Sample Name | Heating Temperature of Face Plate (°C.) | $O_2$ Partial Pressure (Pa) | |
| | | $Al_2O_3$ Layer | $TiO_2$ Layer |
| Sample 1 | 200 | 0.013 | 0.040 |
| Sample 2 | 250 | 0.040 | 0.040 |
| Sample 3 | 100 | 0.065 | 0.065 |
| Sample 4 | No Heating | 0.070 | 0.070 |
| Sample 5 | 200 | 0.020 | 0.020 |
| Sample 6 | 150 | 0.040 | 0.040 |
| Sample of Comparative Example 3 | 200 | 0.013 | 0.013 |

COMPARATIVE EXAMPLE 3

In the same vacuum vapor deposition apparatus as in Example 1, a face plate for projecting cathode-ray tube having a diagonal length of seven inches was set on a rotary jig and heated up to 200° C., and a vacuum chamber was evacuated to a pressure of $6.7 \times 10^{-4}$ Pa. An oxygen partial pressure was adjusted to be 0.013 Pa upon coating of an $Al_2O_3$ layer and to be 0.040 Pa upon coating of a $TiO_2$ layer, thereby coating an optical interference filter for a green phosphor having a film arrangement shown in Table 3. The obtained sample was cleaned by spraying a 5% aqueous hydrofluoric acid solution at a temperature of 20° C. from a nozzle for 20 seconds and washed with water. As a result, as shown in Table 14, a reduction in film thickness was found in the optical interference filter, and the film was partially peeled. Table 15 shows the result of an electron beam browning test. A portion of the optical interference filter irradiated with an electron beam was yellowed.

From the above results, it is seen that an electron beam coloring resistance of the optical interference plate of the face filter for cathode-ray tube according to each Example of the present invention is improved.

By setting a cutoff wavelength to be, e.g., 540 nm when a phosphor is blue (i.e., when a center wavelength of emission is, e.g., 450 nm) and to be, e.g., 740 nm when a phosphor is red (i.e., when a center wavelength of emission is, e.g., 612 nm), blue and red face plates of cathode-ray tube having an improved coloring resistance with respect to electron beam radiation can be obtained.

As has been described above, since the optical interference filter of the face plate for cathode-ray tube according to each of Examples 8 to 10 does not cause a browning phenomenon upon radiation of an electron beam, a bright image can be projected by using this filter for a projecting tube of a projection type television set.

What is claimed is:

1. A cathode-ray tube having a face plate comprising:
   (a) a plate having an inner surface to which irradiation of a cathode-ray beam is directed;
   (b) a phosphor layer formed on said inner surface of said plate; and
   (c) an optical interference filter formed between said inner surface and said phosphor layer and comprising an odd number, not less than five, of layers in which high-refractive index layers consisting of a high refractive index material and low-refractive index layers consisting of a low refractive index material are alternately stacked, said low-refractive index layers consisting essentially of $Al_2O_3$ and said high-refractive index layers consisting essentially of $TiO_2$, said optical interference filter having a cutoff wavelength $\lambda_o$ with a value between 1.06 $\lambda$ and 1.46 $\lambda$, where $\lambda$ is a center wavelength of an emission spectrum of a phosphor constituting said phosphor layer;
   wherein said optical interference filter is constituted by sequentially stacking, from said inner surface of said plate;
   (i) a high-refractive index layer having an optical thickness of about 0.125 $\lambda_o$+0.25 $\lambda$;
   (ii) a periodically alternating layer in which low- and high-refractive index layers having an optical thickness of about 0.25 $\lambda_o$ are alternately stacked an odd number of times and a layer closest to said phosphor layer is a low-refractive index layer, said periodically alternating layer comprising seven to thirty-one layers; and
   (iii) a high-refractive index layer having an optical thickness of about 0.125 $\lambda_o$+0.25 $\lambda$.

2. A cathode-ray tube having a face plate comprising:
   (a) a plate having an inner surface to which irradiation of a cathode-ray beam is directed;
   (b) a phosphor layer formed on said inner surface of said plate; and
   (c) an optical interference filter formed between said inner surface and said phosphor layer and comprising an odd number, not less than five, of layers in which high-refractive index layers consisting of a high refractive index material and low-refractive index layers consisting of a low refractive index material are alternately stacked, said low-refractive index layers consisting essentially of $Al_2O_3$ and said high-refractive index layers consisting essentially of $TiO_2$, said optical interference filter having a cutoff wavelength $\lambda_o$ with a value between 1.06 $\lambda$ and 1.46 $\lambda$, and $\lambda$ is a center wavelength of an emission spectrum of a phosphor constituting said phosphor layer;
   wherein said optical interference filter is constituted by sequentially stacking, from said inner surface of said plate;
   (i) a low-refractive index layer having an optical thickness of about 0.125 $\lambda_o$;
   (ii) a periodically alternating layer in which high-refractive index layers having an optical thickness of about 0.25 $\lambda_o$ and low-refractive index layers having an optical thickness of about 0.25 $\lambda_o$ are alternately stacked an odd number of times and a layer closest to said phosphor layer is a high-refractive index layer; and
   (iii) a low-refractive index layer having an optical thickness of about 0.125 $\lambda_o$.

3. A cathode-ray tube according to claim 1 or 2, wherein said cutoff wavelength $\lambda_o$ is 1.08 $\lambda$ to 1.30 80.

4. A cathode-ray tube according to claim 1 or 2, wherein said periodically alternating layer is constituted by 13 to 23 layers.

5. A cathode-ray tube according to claim 1 or 2, wherein said low-refractive index layer additionally contains $SiO_2$ or $MgF_2$ having a refractive index lower than that of $Al_2O_3$.

6. A cathode-ray tube according to claim 1 or 2, wherein said low-refractive index layer additionally contains an oxide having a refractive index higher than that of $Al_2O_3$ in an amount so as to not significantly change the refractive index of $Al_2O_3$.

7. A cathode-ray tube according to claim 1 or 2, wherein said low-refractive index layer consists of $Al_2O_3$.

8. A cathode-ray tube according to claim 1 or 2, wherein said high-refractive index layer consists of $TiO_2$.

9. A cathode-ray tube according to claim 1 or 2, wherein a difference between the refractive indexes of said high- and low-refractive index layers is not less than 0.3.

10. A cathode-ray tube according to claim 1 or 2, wherein said high-and low-refractive index layers are oxide layers coated on said oxide and formed by radiating $O_2$ ions onto said inner surface of said plate in a reduced-pressure atmosphere containing $O_2$.

11. A cathode-ray tube according to claim 1 or 2, wherein said high-refractive index layer additionally contains an oxide in an amount so as to not significantly reduce the refractive index of $TiO_2$.

12. A cathode-ray tube according to claim 11, wherein said high-refractive index layer additionally contains one or a plurality of oxides selected from the group consisting of $Al_2O_3$, $SiO_2$, $Ta_2O_5$, $ZrO_2$, $SnO_2$, $CeO_2$, $Pr_6O_{11}$, $Y_2O_3$, $Vb_2O_3$ and $HfO_2$.

13. A cathode-ray tube having a face plate comprising:
   (a) a plate having an inner surface to which irradiation of a cathode-ray beam is directed;
   (b) a phosphor layer; and
   (c) an optical interference filter, formed between said inner surface f said plate and said phosphor layer, comprising, by sequentially stacking from said inner surface of said plate:
   (i) a high-refractive index layer having an optical thickness of about 0.25 $\lambda$+0.125 $\lambda_o$, where $\lambda_o$ is the cutoff wavelength of said optical interference filter and has a value between 1.05 $\lambda$ and 1.50 $\lambda$, where $\lambda$ is the center wavelength of an emission spectrum of a phosphor constituting said phosphor layer;
   (ii) a periodically alternating layer having an odd number, not less than three nor more than thirty-one of layers in which low-refractive index layers having an optical thickness of about 0.25 $\lambda_o$ and high-refractive index layers having an optical thickness of about 0.25 $\lambda_o$ are alternately stacked and a layer closest to said phosphor layer is a low-refractive index layer;
   (iii) a high-refractive index layer having an optical thickness of about 0.25 $\lambda_o$+0.125 $\lambda_o$; and (iv) an outermost layer in contact with said phosphor layer, said outermost layer having a physical thickness of not less than 10 nm and consisting of $Al_2O_3$ of $ZrO_2$.

14. A cathode-ray tube according to claim 13, wherein said periodically alternating layer is constituted by nine to 25 layers.

15. A cathode-ray tube according to claim 13, wherein said $\lambda_o$ is 1.10 $\lambda$ to 1.35 $\lambda$.

* * * * *